(12) United States Patent
Sirinorakul et al.

(10) Patent No.: US 9,805,955 B1
(45) Date of Patent: Oct. 31, 2017

(54) SEMICONDUCTOR PACKAGE WITH MULTIPLE MOLDING ROUTING LAYERS AND A METHOD OF MANUFACTURING THE SAME

(71) Applicant: UTAC Headquarters PTE. LTD., Singapore (SG)

(72) Inventors: Saravuth Sirinorakul, Bangkok (TH); Suebphong Yenrudee, Bangkok (TH)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 15/347,641

(22) Filed: Nov. 9, 2016

Related U.S. Application Data

(60) Provisional application No. 62/253,601, filed on Nov. 10, 2015.

(51) Int. Cl.
*H01L 21/48* (2006.01)
*H01L 23/00* (2006.01)
*H01L 23/495* (2006.01)
*H01L 23/498* (2006.01)

(52) U.S. Cl.
CPC ........ *H01L 21/4825* (2013.01); *H01L 21/486* (2013.01); *H01L 21/4867* (2013.01); *H01L 23/49527* (2013.01); *H01L 23/49534* (2013.01); *H01L 23/49582* (2013.01); *H01L 23/49586* (2013.01); *H01L 23/49805* (2013.01); *H01L 24/48* (2013.01); *H01L 2224/48235* (2013.01)

(58) Field of Classification Search
CPC  H01L 21/486; H01L 21/4867; H01L 21/4825
See application file for complete search history.

(56) References Cited

U.S. PATENT DOCUMENTS

| | | |
|---|---|---|
| 3,611,061 A | 10/1971 | Segerson |
| 4,411,719 A | 10/1983 | Lindberg |
| 4,501,960 A | 2/1985 | Jouvet et al. |
| 4,801,561 A | 1/1989 | Sankhagowit |
| 4,855,672 A | 8/1989 | Shreeve |
| 5,105,259 A | 4/1992 | McShane et al. |
| 5,195,023 A | 3/1993 | Manzione et al. |
| 5,247,248 A | 9/1993 | Fukunaga |
| 5,248,075 A | 9/1993 | Young et al. |
| 5,281,851 A | 1/1994 | Mills et al. |
| 5,292,688 A | 3/1994 | Hsiao |
| 5,396,185 A | 3/1995 | Honma et al. |
| 5,397,921 A | 3/1995 | Kamezos |
| 5,479,105 A | 12/1995 | Kim et al. |

(Continued)

OTHER PUBLICATIONS

Michael Quirk and Julian Serda, Semiconductor Manufacturing Technology, Pearson Education International, Pearson Prentice Hall, 2001, 4 pages.

(Continued)

*Primary Examiner* — Marc Armand
*Assistant Examiner* — Sarah Salerno
(74) *Attorney, Agent, or Firm* — Haverstock & Owens LLP

(57) ABSTRACT

Embodiments of the present invention are directed to a method of manufacturing a semiconductor package with an internal routing circuit. The internal routing circuit is formed from multiple molding routing layers in a plated and etched copper terminal semiconductor package by using an inkjet process to create conductive paths on each molding compound layer of the semiconductor package.

15 Claims, 23 Drawing Sheets

(56) References Cited

U.S. PATENT DOCUMENTS

| | | |
|---|---|---|
| 5,535,101 A | 7/1996 | Miles et al. |
| 5,596,231 A | 1/1997 | Combs |
| 5,843,808 A | 12/1998 | Kamezos |
| 5,959,363 A | 9/1999 | Yamada et al. |
| 5,976,912 A | 11/1999 | Fukutomi et al. |
| 5,990,692 A | 11/1999 | Jeong et al. |
| 6,033,933 A | 3/2000 | Hur |
| 6,072,239 A | 6/2000 | Yoneda et al. |
| 6,111,324 A | 8/2000 | Sheppard et al. |
| 6,159,770 A | 12/2000 | Tetaka et al. |
| 6,177,729 B1 | 1/2001 | Benenati et al. |
| 6,197,615 B1 | 3/2001 | Song et al. |
| 6,208,020 B1 | 3/2001 | Minamio et al. |
| 6,229,200 B1 | 5/2001 | McLellan et al. |
| 6,242,281 B1 | 6/2001 | McLellan et al. |
| 6,250,841 B1 | 6/2001 | Ledingham |
| 6,284,569 B1 | 9/2001 | Sheppard et al. |
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Kamezos et al. |
| 6,329,711 B1 | 12/2001 | Kawahara et al. |
| 6,353,263 B1 | 3/2002 | Dotta et al. |
| 6,372,625 B1 | 4/2002 | Shigeno et al. |
| 6,376,921 B1 | 4/2002 | Yoneda et al. |
| 6,384,472 B1 | 5/2002 | Huang |
| 6,392,427 B1 | 5/2002 | Yang |
| 6,414,385 B1 | 7/2002 | Huang et al. |
| 6,429,048 B1 | 8/2002 | McLellan et al. |
| 6,448,665 B1 | 9/2002 | Nakazawa |
| 6,451,709 B1 | 9/2002 | Hembree |
| 6,455,348 B1 | 9/2002 | Yamaguchi |
| 6,476,469 B2 | 11/2002 | Hung et al. |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,661,104 B2 | 12/2003 | Jiang |
| 6,667,191 B1 | 12/2003 | McLellan |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Fan et al. |
| 6,734,552 B2 | 5/2004 | Combs et al. |
| 6,737,755 B1 | 5/2004 | McLellan et al. |
| 6,750,546 B1 | 6/2004 | Villanueva et al. |
| 6,764,880 B2 | 7/2004 | Wu et al. |
| 6,781,242 B1 | 8/2004 | Fan et al. |
| 6,800,948 B1 | 10/2004 | Fan et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,894,376 B1 | 5/2005 | Mostafazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,041,533 B1 | 5/2006 | Akram et al. |
| 7,045,883 B1 | 5/2006 | McCann et al. |
| 7,049,177 B1 | 5/2006 | Fan et al. |
| 7,052,935 B2 | 5/2006 | Pai et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,126,218 B1 | 10/2006 | Darveaux et al. |
| 7,205,178 B2 | 4/2007 | Shiu et al. |
| 7,224,048 B1 | 5/2007 | McLellan et al. |
| 7,247,526 B1 | 7/2007 | Fan et al. |
| 7,253,503 B1 | 8/2007 | Fusaro et al. |
| 7,259,678 B2 | 8/2007 | Brown et al. |
| 7,268,415 B2 | 9/2007 | Abbott et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,459,345 B2 | 12/2008 | Hwan |
| 7,476,975 B2 | 1/2009 | Ogata |
| 7,482,690 B1 | 1/2009 | Fan et al. |
| 7,495,319 B2 | 2/2009 | Fukuda et al. |
| 7,595,225 B1 | 9/2009 | Fan et al. |
| 7,608,484 B2 | 10/2009 | Lange et al. |
| 7,709,857 B2 | 5/2010 | Kim et al. |
| 7,714,418 B2 | 5/2010 | Lim et al. |
| 8,710,651 B2 | 4/2014 | Sakata et al. |
| 9,006,034 B1 | 4/2015 | Sirinorakul |
| 2001/0005047 A1 | 6/2001 | Jimarez et al. |
| 2001/0007285 A1 | 7/2001 | Yamada et al. |
| 2002/0090162 A1 | 7/2002 | Asada et al. |
| 2002/0109214 A1 | 8/2002 | Minamio et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0102540 A1 | 6/2003 | Lee |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1 | 12/2003 | Pedron et al. |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2005/0184404 A1 | 8/2005 | Huang et al. |
| 2005/0236701 A1 | 10/2005 | Minamio et al. |
| 2005/0263864 A1 | 12/2005 | Islam et al. |
| 2006/0019481 A1 | 1/2006 | Liu et al. |
| 2006/0071351 A1 | 4/2006 | Lange |
| 2006/0170081 A1 | 8/2006 | Gerber et al. |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0237231 A1 | 10/2006 | Hata et al. |

(56) References Cited

U.S. PATENT DOCUMENTS

| | | |
|---|---|---|
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0093000 A1 | 4/2007 | Shim et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2008/0251913 A1 | 10/2008 | Inomata |
| 2008/0293232 A1 | 11/2008 | Kang et al. |
| 2009/0014848 A1 | 1/2009 | Ong Wai Lian et al. |
| 2009/0152691 A1 | 6/2009 | Nguyen et al. |
| 2009/0152694 A1 | 6/2009 | Bemmert et al. |
| 2009/0230525 A1 | 9/2009 | Chang Chien et al. |
| 2009/0236713 A1 | 9/2009 | Xu et al. |
| 2009/0321778 A1 | 12/2009 | Chen et al. |
| 2010/0133565 A1 | 6/2010 | Cho et al. |
| 2010/0149773 A1 | 6/2010 | Said |
| 2010/0178734 A1 | 7/2010 | Lin |
| 2010/0224971 A1 | 9/2010 | Li |
| 2010/0327432 A1 | 12/2010 | Sirinorakul |
| 2011/0115061 A1 | 5/2011 | Krishnan et al. |
| 2011/0201159 A1 | 8/2011 | Mori et al. |
| 2012/0146199 A1 | 6/2012 | McMillan et al. |
| 2012/0178214 A1 | 7/2012 | Lam |
| 2013/0069221 A1 | 3/2013 | Lee et al. |

OTHER PUBLICATIONS

Office Action dated Sep. 16, 2013, U.S. Appl. No. 13/689,531, filed Nov. 29, 2012, Saravuth Sirinorakul et al., 24 pages.

Office Action dated Dec. 20, 2013, U.S. Appl. No. 13/689,531, filed Nov. 29, 2012, Saravuth Sirinorakul et al., 13 pages.

Office Action dated Nov. 2, 2015, U.S. Appl. No. 12/834,688, filed Jul. 12, 2010, Saravuth Sirinorakul, 17 pages.

Notice of Allowance dated Feb. 27, 2015, U.S. Appl. No. 13/689,566, filed Nov. 29, 2012, Saravuth Sirinorakul, 8 pages.

Office Action from the U.S. Patent Office, U.S. Appl. No. 12/002,054, filed Dec. 14, 2007, First Named Inventor: Somchai Nondhasitthichai, dated Aug. 19, 2015, 17 pages.

Notice of Allowance from the U.S. Patent Office, U.S. Appl. No. 12/378,119, filed Feb. 10, 2009, First Named Inventor: Somchai Nondhasitthichai, dated Jul. 23, 2015, 7 pages.

Office Action dated Dec. 19, 2012, U.S. Appl. No. 12/834,688, filed Jul. 12, 2010, Saravuth Sirinorakul, 26 pages.

Top View: Die with wire bonding

Bottom View: Package terminal

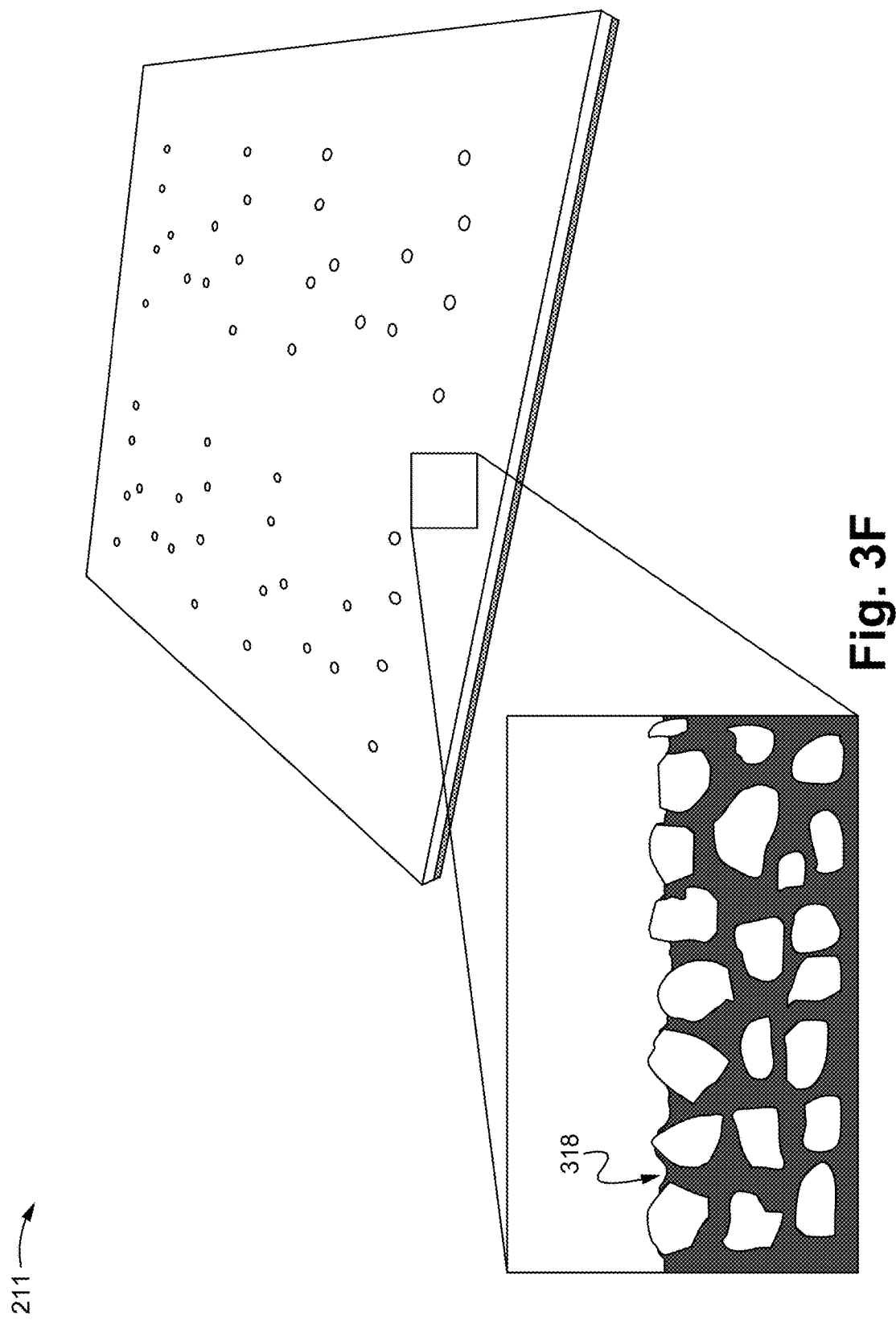

SEMICONDUCTOR PACKAGE WITH MULTIPLE MOLDING ROUTING LAYERS AND A METHOD OF MANUFACTURING THE SAME

RELATED APPLICATIONS

This application claims benefit of priority under 35 U.S.C. section 119(e) of the U.S. Provisional Patent Application Ser. No. 62/253,601, filed Nov. 10, 2015, entitled "Semiconductor Package with Multi Molding Routing Layers," which is hereby incorporated by reference in its entirety.

FIELD OF INVENTION

The present invention is related to the field of semiconductor package manufacturing. More specifically, the present invention relates to a semiconductor package with an internal routing circuit formed from multiple molding routing layers in the package.

BACKGROUND OF THE INVENTION

There is a growing demand for high-performance semiconductor packages. However, increases in semiconductor circuit density pose interconnect challenges for a packaged chip's thermal, mechanical and electrical integrity. Thus, there is a need for a method of manufacturing a semiconductor package with improved routing capabilities.

BRIEF SUMMARY OF THE INVENTION

Embodiments of the present invention are directed to a method of manufacturing a semiconductor package with an internal routing circuit. The internal routing circuit is formed from multiple molding routing layers in a plated and etched copper terminal semiconductor package by using an inkjet process to create conductive paths on each molding compound layer of the semiconductor package.

In one aspect, a semiconductor package is provided. The semiconductor package includes package terminals, and a copper leadframe routing layer that includes copper routing circuits. The copper routing circuits are formed on a first side of a copper leadframe and the package terminals are formed on a second side of the copper leadframe.

The semiconductor package also includes at least one conductive ink printed routing layer. Each of the at least one conductive ink printed routing layer includes a plurality of interconnections coupled with routing circuits associated with a previous routing layer that is directly beneath the current conductive ink printed routing layer, and an intermediary insulation layer formed on top of the previous routing layer. The plurality of interconnections protrudes from a top surface of the intermediary insulation layer that has an unnatural surface roughness that is rougher than the natural surface roughness of the intermediary insulation layer. Molding compound of the intermediary insulation layer surrounds the routing circuits associated with the previous routing layer. Each of the at least one conductive ink printed routing layer also includes conductive ink routing circuits adhered on the unnaturally roughened top surface of the intermediary insulation layer. The conductive ink routing circuits includes a plurality of conductive ink printed layers.

In some embodiments, the routing circuits associated with each routing layer is structured differently from the routing circuits associated with other routing layers. In some embodiments, the conductive ink routing circuits associated with each of the at least one conductive ink printed routing layer is structured differently from the conductive ink routing circuits associated with other conductive ink printed routing layers.

In some embodiments, the conductive ink includes powdered or flaked silver and carbon-like materials.

The semiconductor package includes an internal routing circuit from die terminals on the die to the package terminals. The internal routing circuit is formed by all the routing layers in the semiconductor package. The semiconductor package also includes a die coupled with a topmost conductive ink printed routing layer, a topmost insulation layer encapsulating the die and the topmost conductive ink routing layer, and a bottommost insulation layer encapsulating the copper routing circuits.

In another aspect, a method of manufacturing semiconductor devices that includes a plurality of conductive routing layers is provided. The method includes obtaining an etched and plated leadframe that includes a plurality of copper routing circuits and a plurality of package terminals, wherein the plurality of copper routing circuits forms a copper leadframe routing layer. In some embodiments, obtaining an etched and plated leadframe includes etching a copper substrate to form the plurality of copper routing circuits at a top surface of the copper substrate, and plating a plurality of areas on surfaces of the copper substrate, thereby resulting in the etched and plated leadframe. The plurality of areas includes bottom plated areas that eventually form the plurality of package terminals and includes top plated areas that are on the plurality of copper routing circuits.

The method also includes forming at least one conductive ink printed routing layer on top of the copper leadframe routing layer. Each of the at least one conductive ink printed routing layer is formed by coupling a plurality of interconnections with routing circuits associated with a previous routing layer that is directly beneath the current conductive ink printed routing layer being formed, forming an intermediary insulation layer on top of the previous routing layer, wherein the plurality of interconnections protrudes from a top surface of the intermediary insulation layer that has the natural surface roughness, performing an abrasion procedure to roughen at least the top surface of the intermediary insulation layer such that, after the abrasion procedure, the top surface of the intermediary insulation layer has an unnatural surface roughness that is rougher than the natural surface roughness, and adhering a conductive ink layer on the roughened top surface of the intermediary insulation layer to form a plurality of conductive ink routing circuits that is included in the current conductive ink printed routing layer.

In some embodiments, the abrasion procedure includes coating at least the top surface of the intermediary insulation layer with an adhesion promoter material, heating the leadframe such that the adhesion promoter material reacts with a portion of the intermediary insulation layer, and etching away a baked film, resulting in the top surface of the intermediary insulation layer having the unnatural surface roughness that is rougher than the natural surface roughness.

In some embodiments, each of the at least one conductive ink printed routing layer is further formed by, after performing an abrasion procedure and before adhering a conductive ink layer on the roughened top surface, printing a catalyst material on the roughened top surface of the intermediary insulation layer, wherein the printing of the catalyst material forms a structure of the plurality of conductive ink routing circuits.

In some embodiments, adhering a conductive ink layer on the roughened top surface includes using a conductive ink and transforming the conductive ink to conductive solid, wherein the adhesion of the conductive ink layer with the intermediary insulation layer having the unnatural surface roughness is better than the adhesion of the conductive ink layer with the intermediary insulation layer having the natural surface roughness.

In some embodiments, each of the at least one conductive ink printed routing layer is further formed by, after adhering a conductive ink layer on the roughened top surface, obtaining a desired thickness of the conductive ink routing circuits whereby conductive ink is printed on conductive ink. The desired thickness of the conductive ink routing circuits can be obtained via a printing process, wherein the printing process includes repeating the printing a catalyst material step and the adhering step in one or more loops.

The method also includes coupling a plurality of dies with a topmost conductive ink printed routing layer, encapsulating the plurality of dies and the topmost conductive ink routing layer with a topmost insulation layer, etching away exposed copper at the bottom of the leadframe, thereby isolating the plurality of package terminals and exposing the plurality of copper routing circuits at the bottom of the leadframe, encapsulating the plurality of exposed copper routing circuits at the bottom of the leadframe with a bottommost insulation layer, and performing a cut-through procedure to singulate the semiconductor packages from each other.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

In the following description, numerous details are set forth for purposes of explanation. However, one of ordinary skill in the art will realize that the invention can be practiced without the use of these specific details. Thus, the present invention is not intended to be limited to the embodiments shown but is to be accorded the widest scope consistent with the principles and features described herein.

Figure 1A:
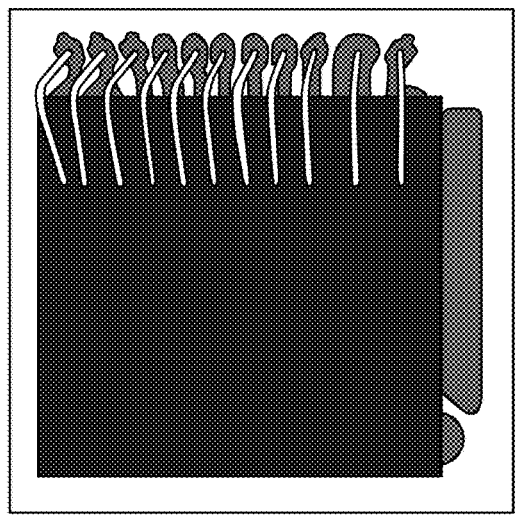
FIG. 1A illustrates an exemplary top view of a semiconductor die and an exemplary bottom view of a semiconductor package that shows package terminals.
Figure 1A:
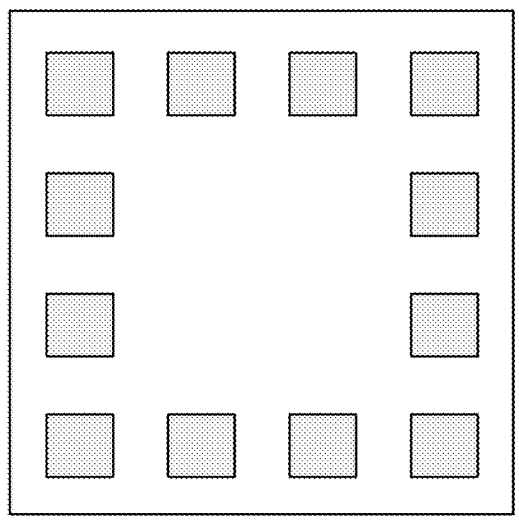

FIG. 1A illustrates an exemplary top view of a semiconductor die and an exemplary bottom view of a semiconductor package that includes exposed package terminals. Although FIG. 1A illustrates the semiconductor die being electrically coupled therein using wire bonds, it is contemplated that the semiconductor die can instead be electrically coupled using flip-chip bonds, such as solder bumps. Regardless of how the semiconductor die is coupled therein, an internal routing circuit of the semiconductor (IC) package provides for internal routing from die terminals of the semiconductor die to the package terminals of the semiconductor package.

Embodiments of the present invention are directed to a method of manufacturing a semiconductor package with an internal routing circuit. The internal routing circuit is formed from multiple molding routing layers in a plated and etched copper terminal semiconductor package by using an inkjet process to create conductive paths on each molding compound layer of the semiconductor package.

Figure 1B:
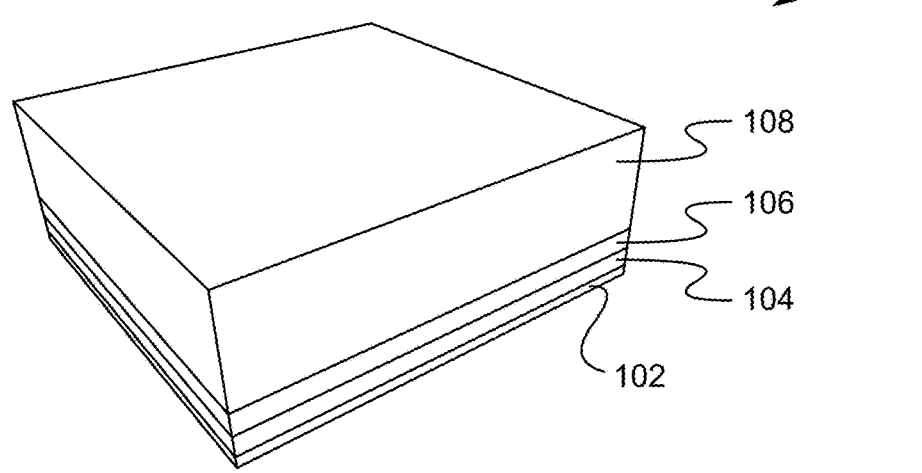
FIG. 1B illustrates an exemplary external view of a final singulated semiconductor package in accordance with some embodiments.
Figure 1C:
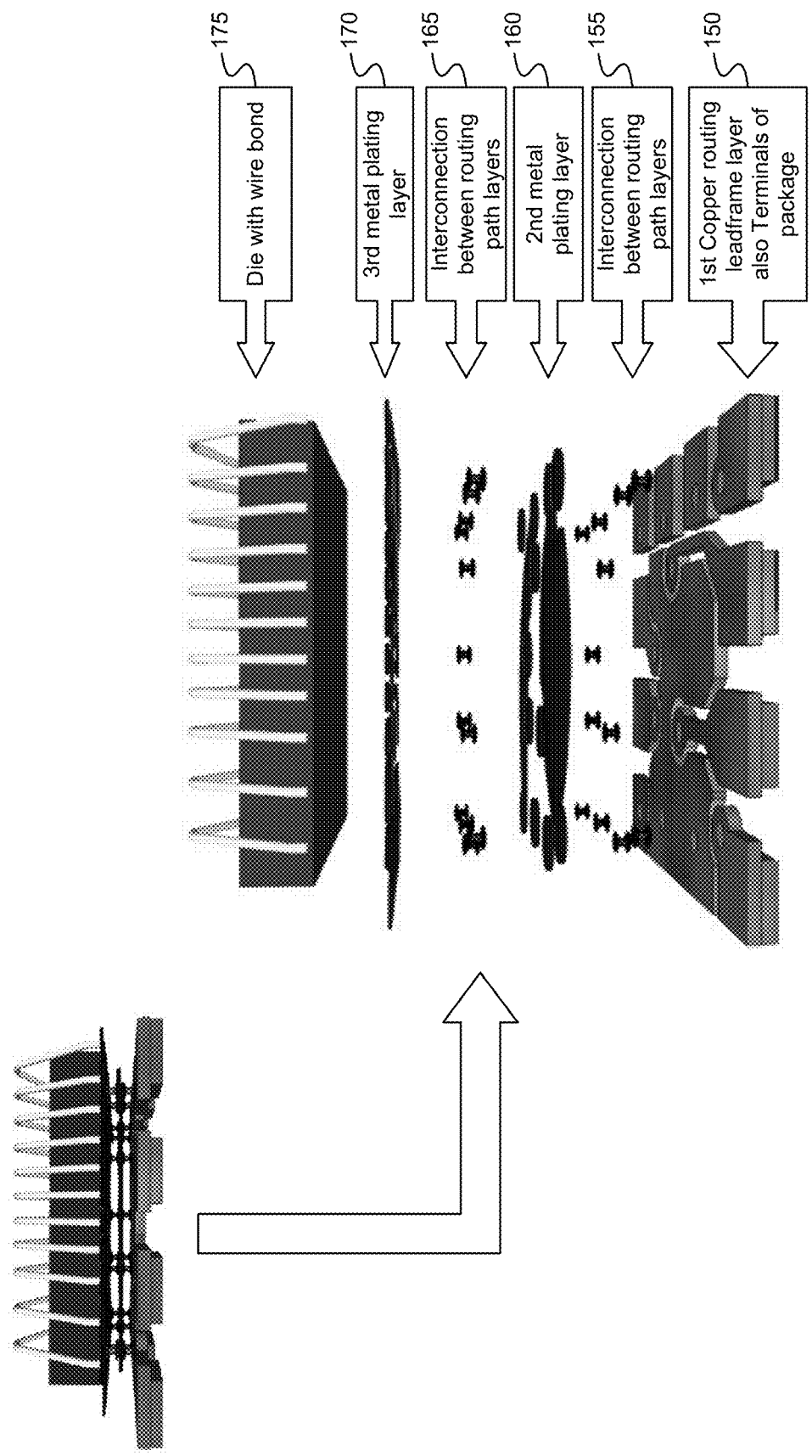
FIG. 1C illustrates an exemplary internal view of the semiconductor package of FIG. 1B in accordance with some embodiments.

FIG. 1B illustrates an exemplary external view of a final singulated semiconductor package 100 in accordance with some embodiments, while FIG. 1C illustrates an exemplary internal view of the semiconductor package 100, without molding compounds to show the structure of the internal routing circuit, in accordance with some embodiments. The internal routing circuit is formed from multiple molding routing path layers in the package 100.

The semiconductor package 100, as shown, includes three conductive routing path layers 150, 160, 170 electrically coupled via interconnections 155, 165 that are disposed between the routing path layers 150, 160, 170. The conductive routing path layers 150, 160, 170 form at least partially the internal routing circuit of the semiconductor package 100. However, it is noted that by the concepts discussed herein, more or less conductive routing layers can be formed within a semiconductor package. Typically, the topmost conductive routing path layer (e.g., conductive routing path layer 170 in FIG. 1C) is physically and electrically coupled with the semiconductor die 175, while the bottommost conductive routing path layer (e.g., conductive routing path layer 150 in FIG. 1C) is physically and electrically coupled with the package terminals. Each of the conductive routing path layers 150, 160, 170 and the semiconductor die 175 corresponds to a distinct and separate molding compound layer 102, 104, 106, 108. Generally, if there are N routing path layers, where N is an integer greater or equal to 1, then there are N+1 molding compound layers. In some embodiments, N is greater or equal to 2. In some embodiments, each layer of the molding compound 102-108 is visually indistinguishable from the other layers of the molding compound 102-108. Alternatively, each layer of the molding compounds 102-108 is visually distinguishable from the other layers of the molding compound 102-108.

In some embodiments, the bottommost conductive routing path layer is a copper leadframe routing layer and each subsequent conductive routing path layer formed above the bottommost conductive routing path layer is a conductive ink printed routing layer.

Figure 2:
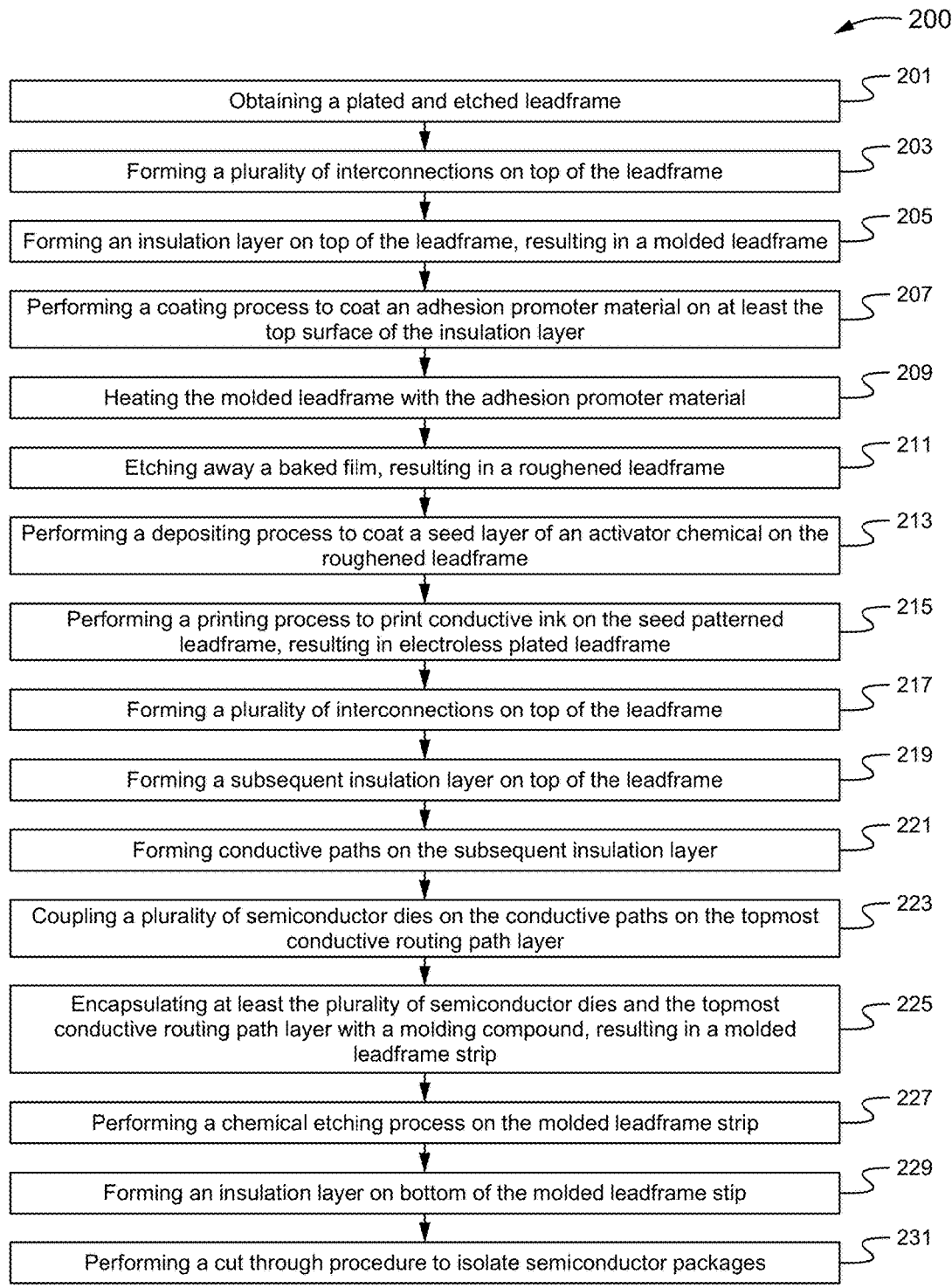
FIG. 2 illustrates an exemplary method of manufacturing a semiconductor package in accordance to some embodiments.
Figure 3A:
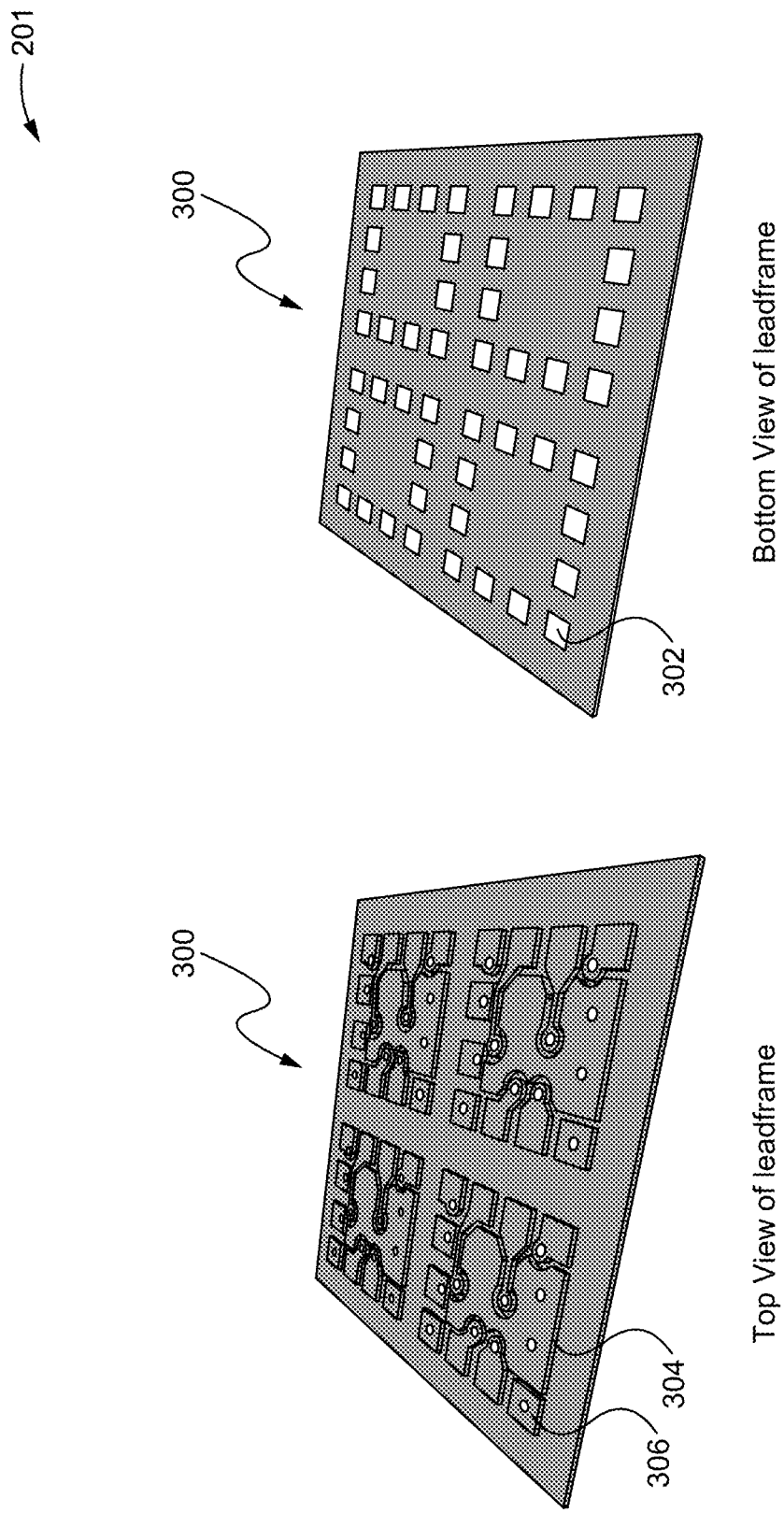
FIG. 3A-FIG. 3P illustrate an exemplary result produced at each step of the method of FIG. 2.
Figure 3B:
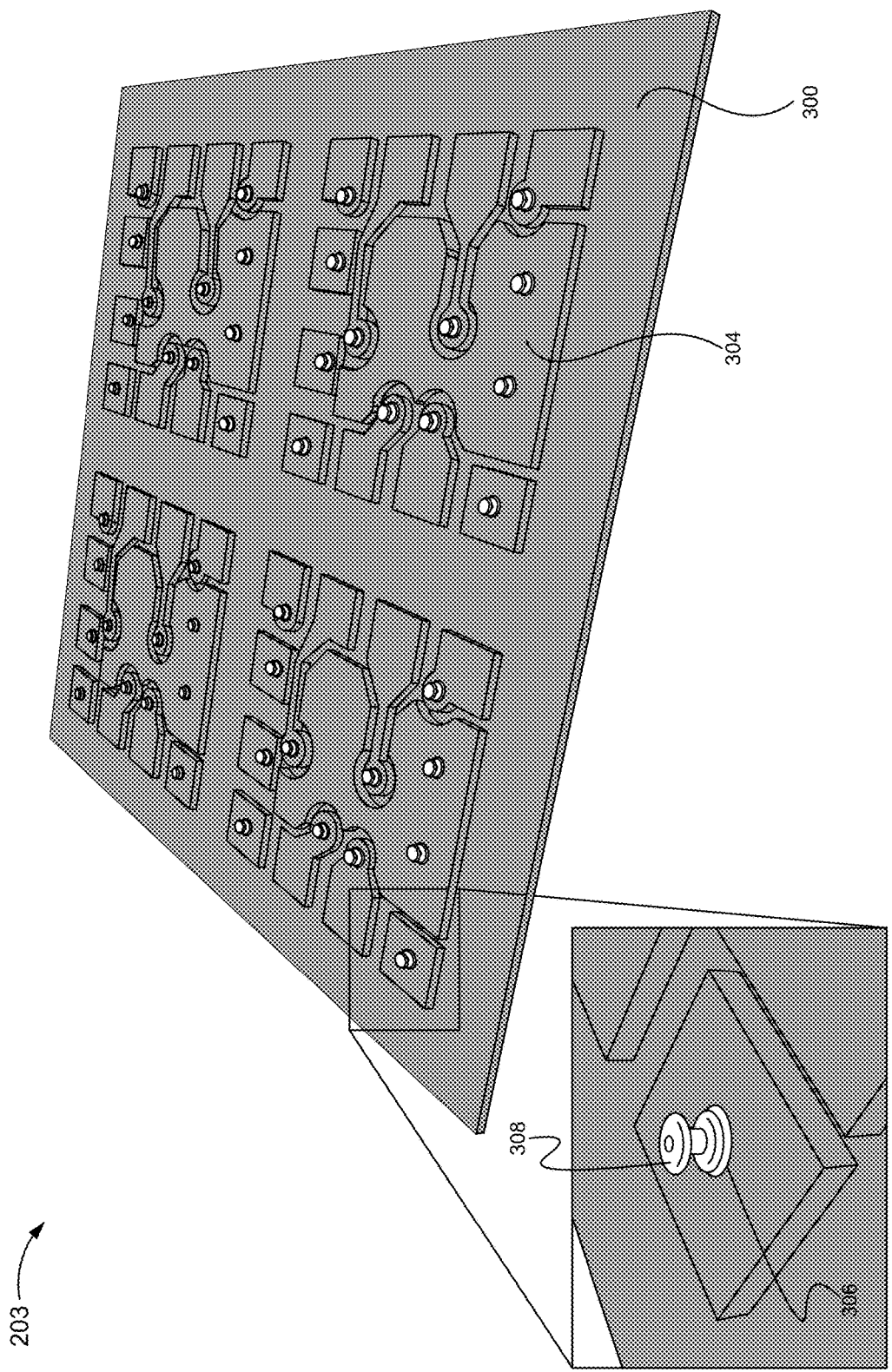
Figure 3C:
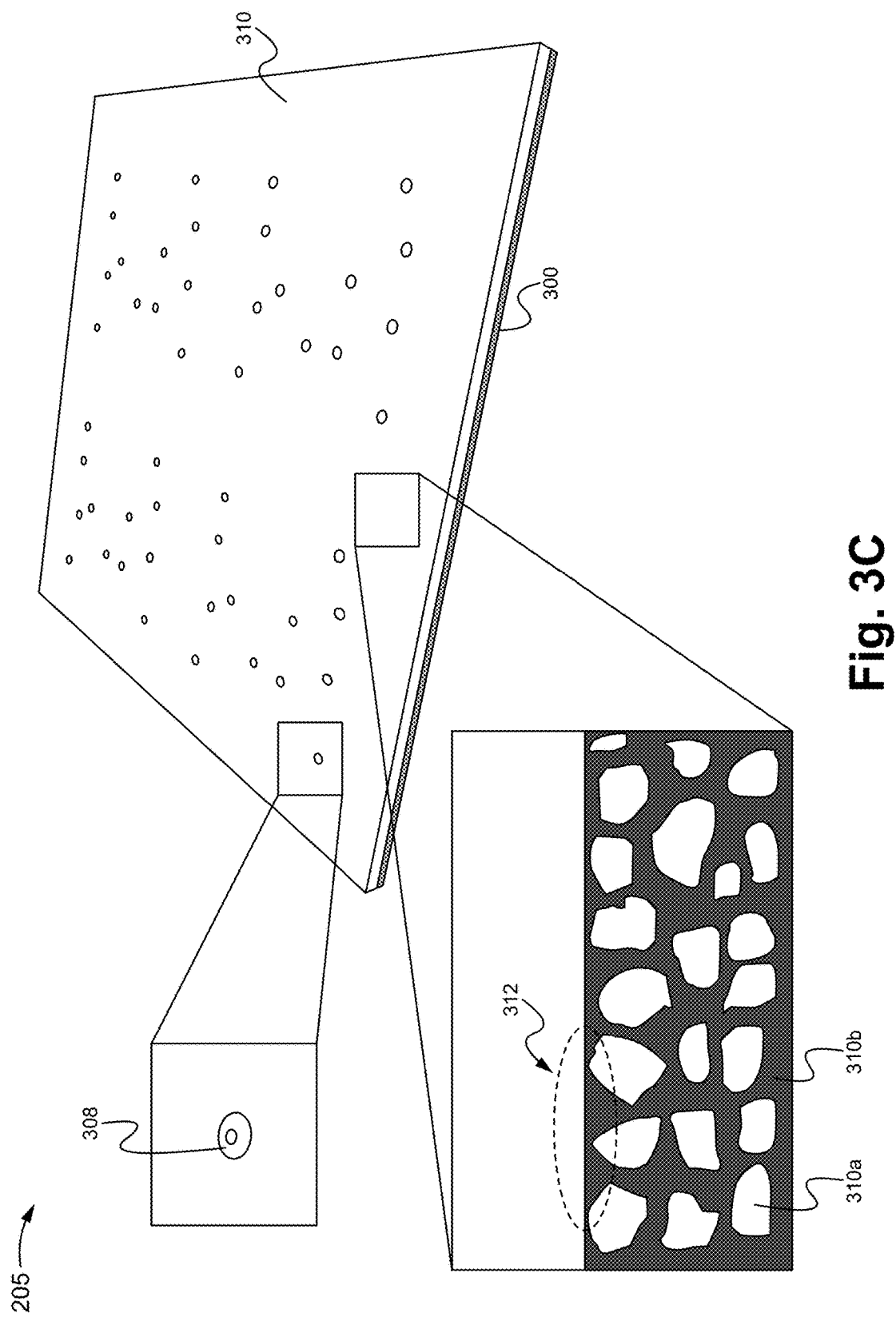
Figure 3D:
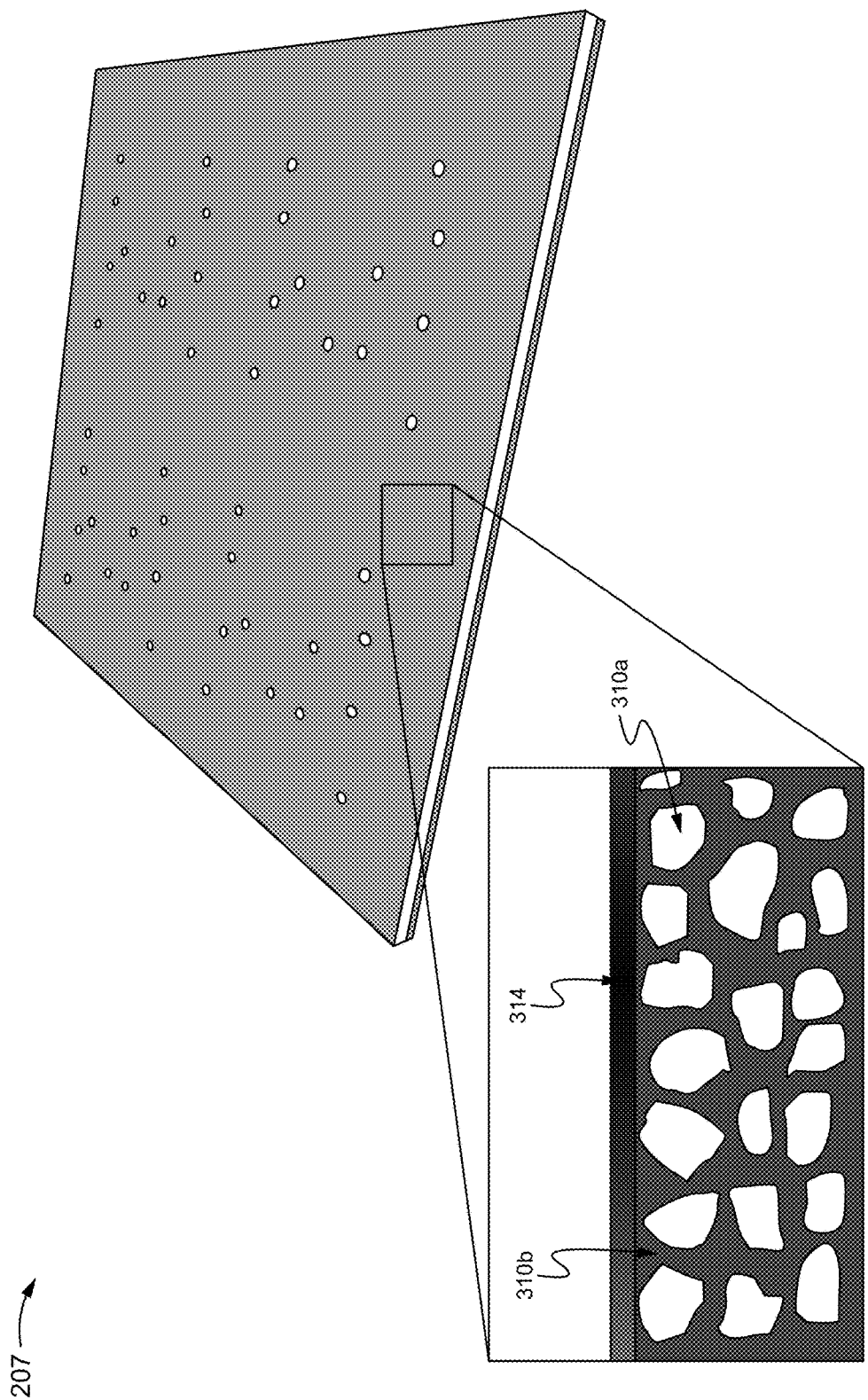
Figure 3E:
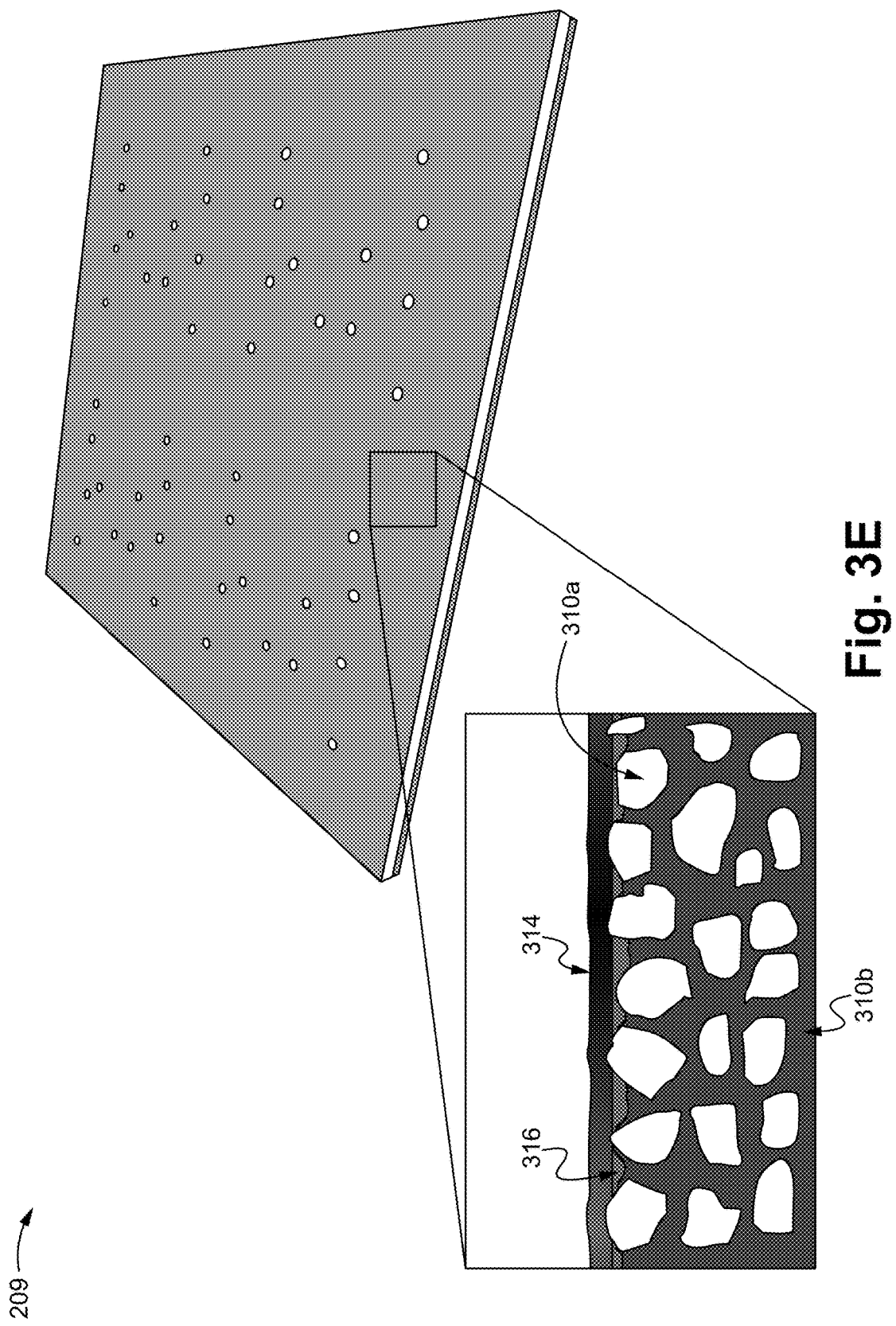
Figure 3G:
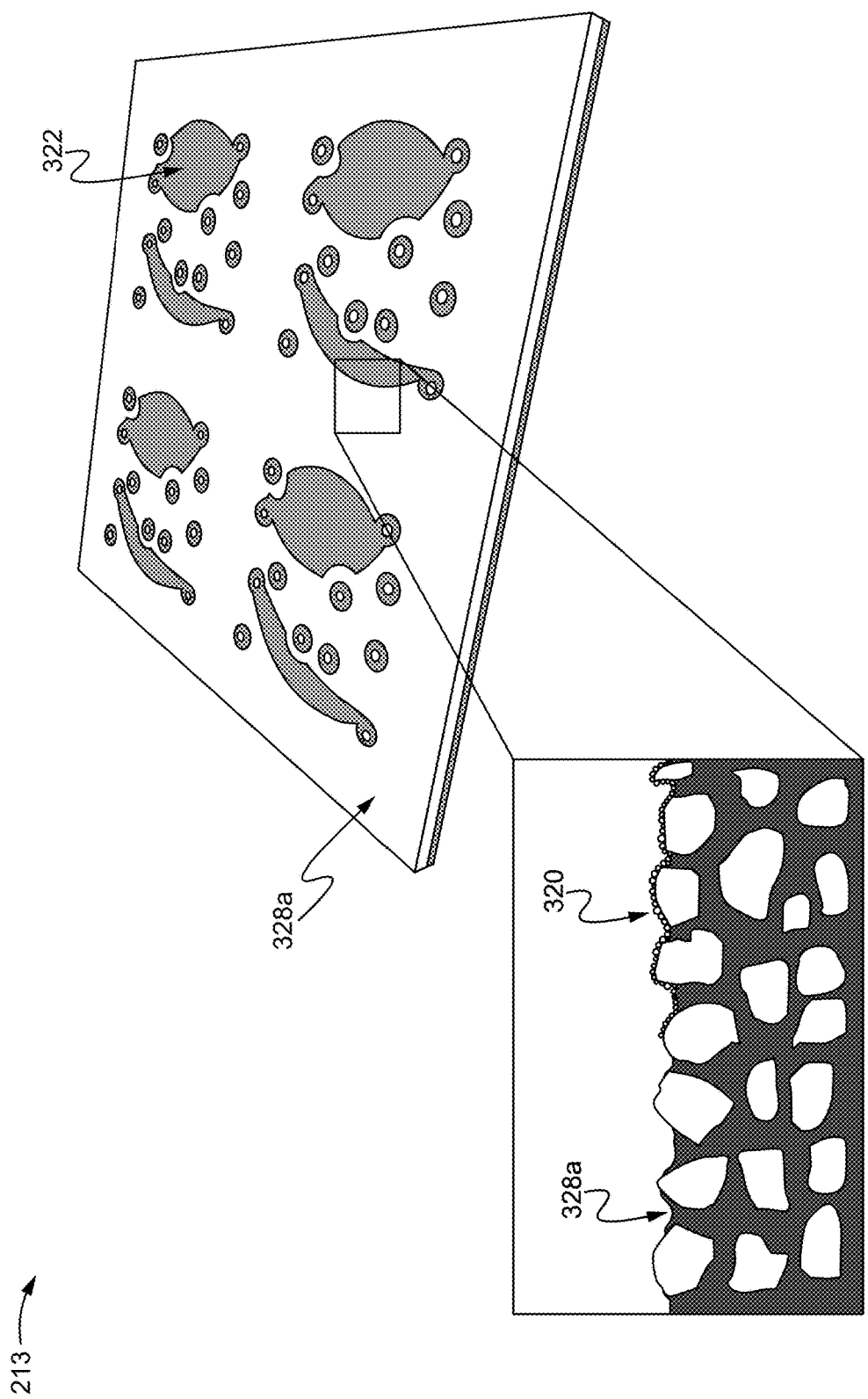
Figure 3H:
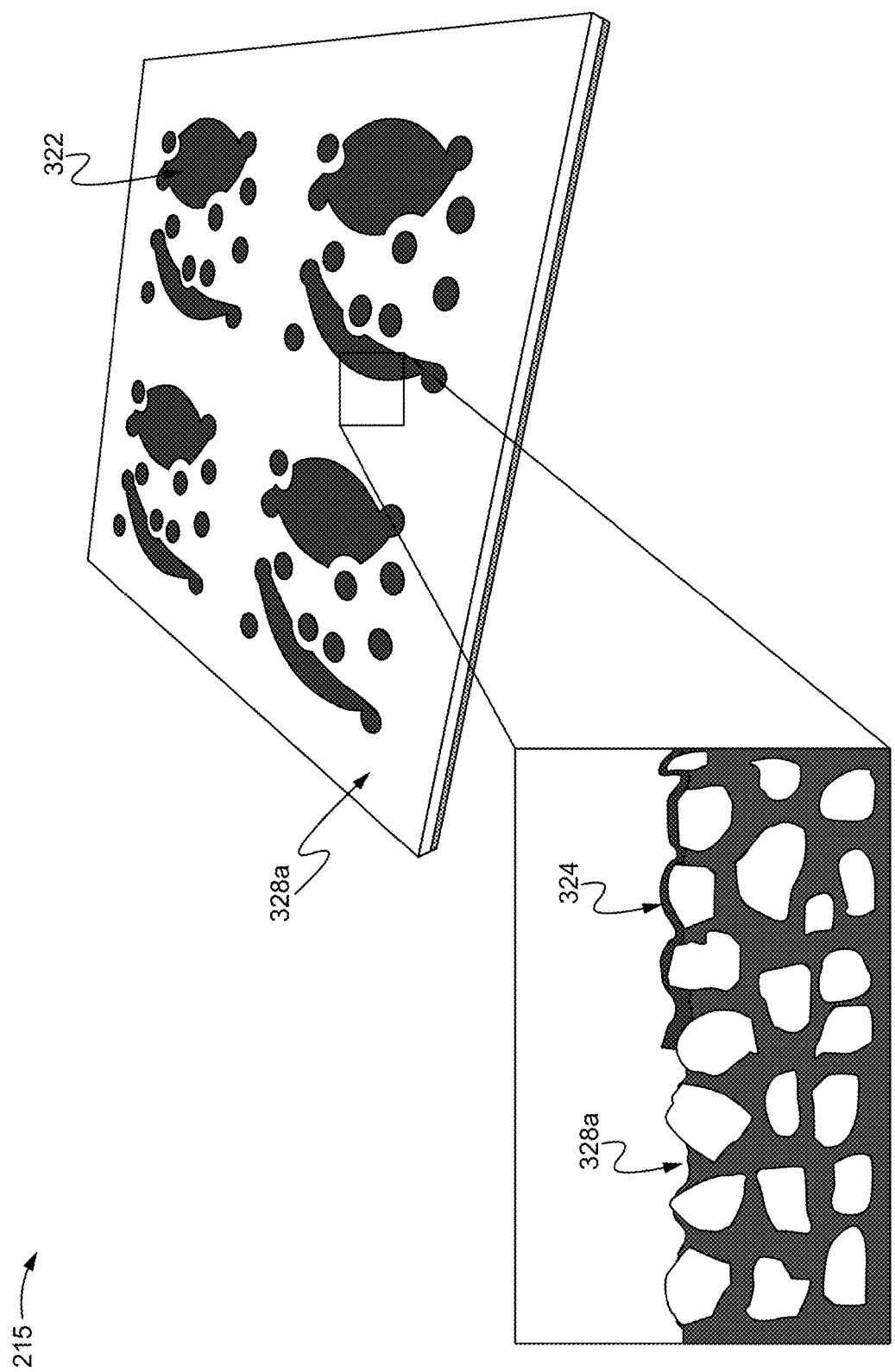
Figure 3I:
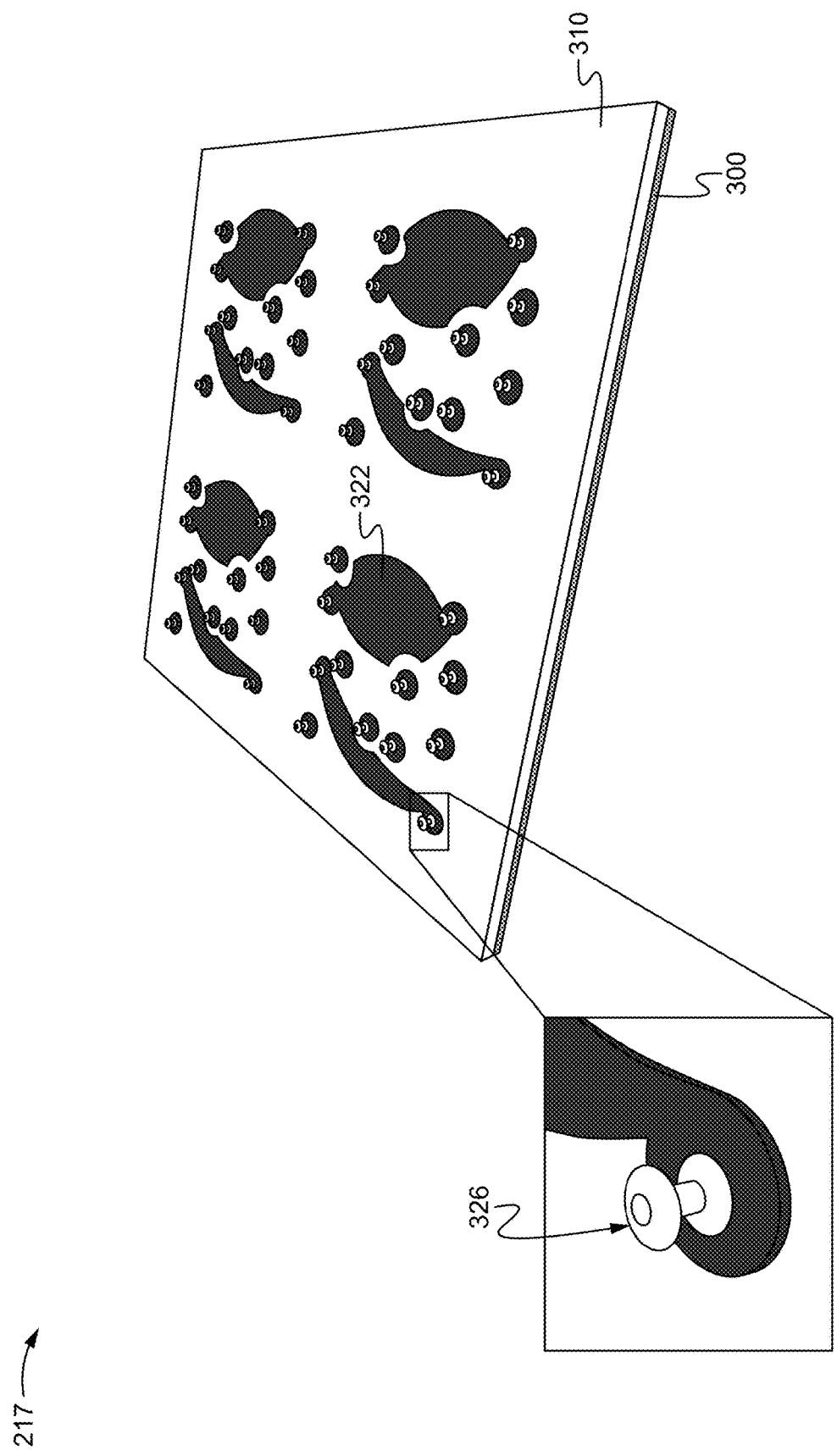
Figure 3J:
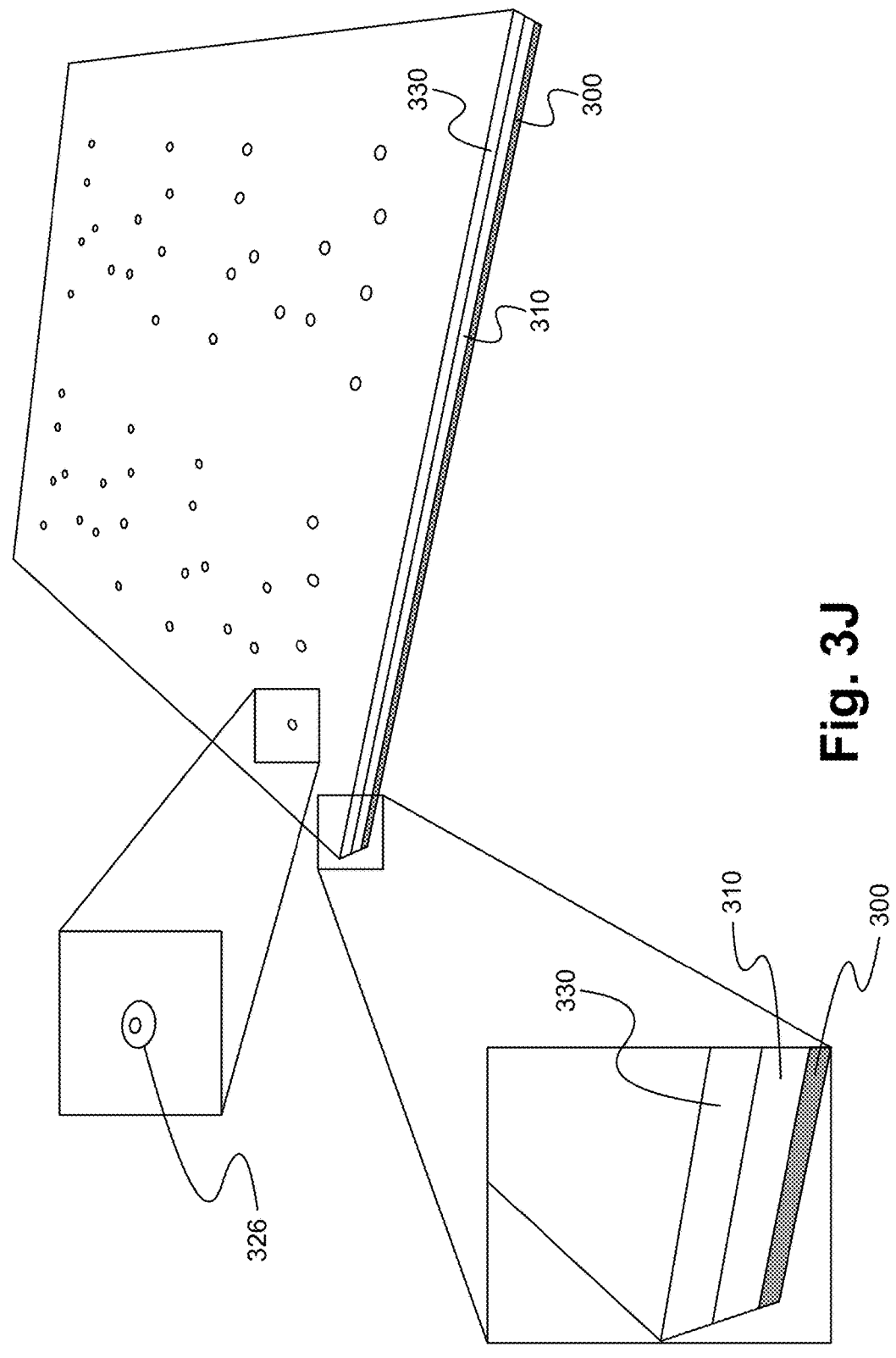
Figure 3K:
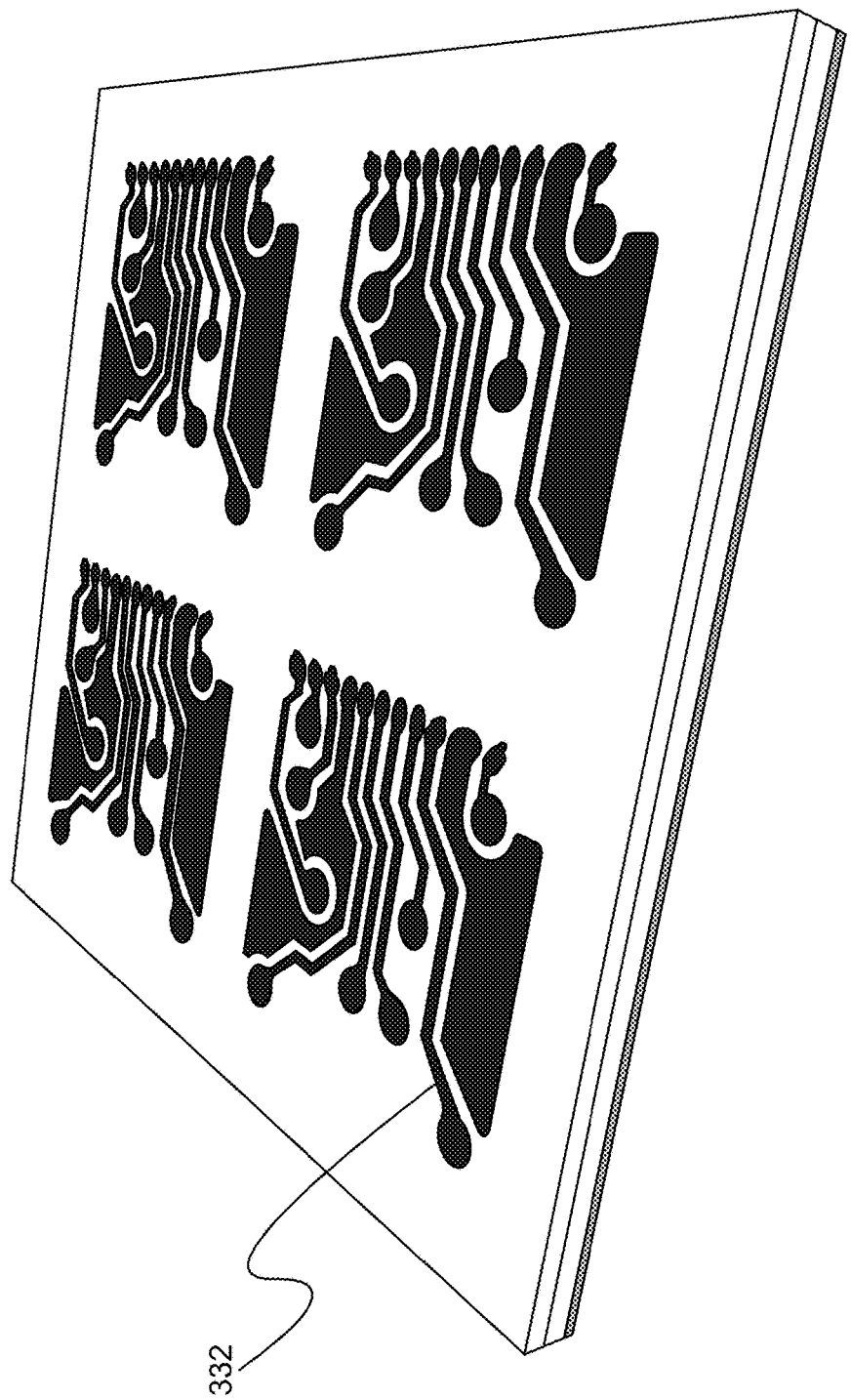
Figure 3L:
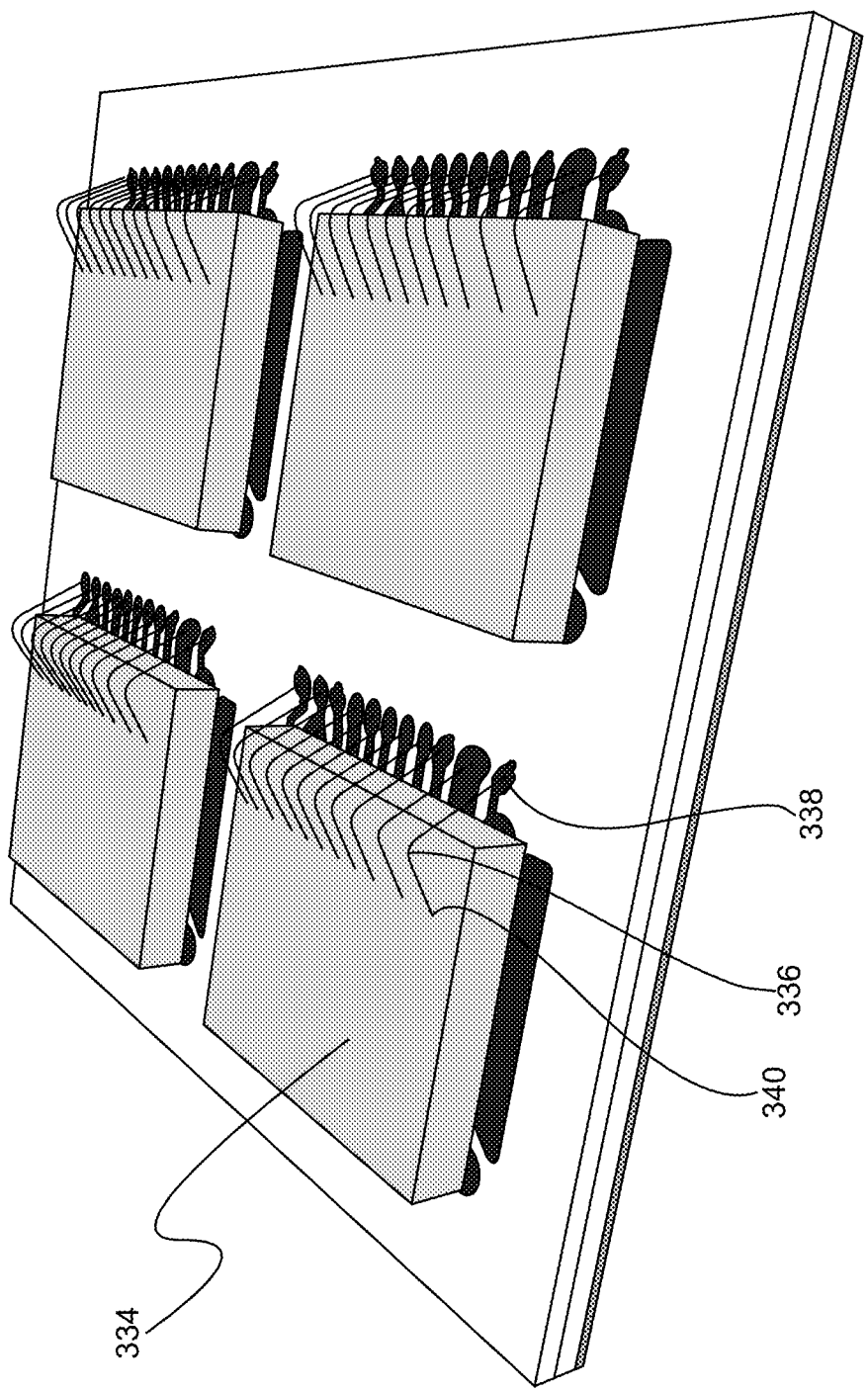
Figure 3M:
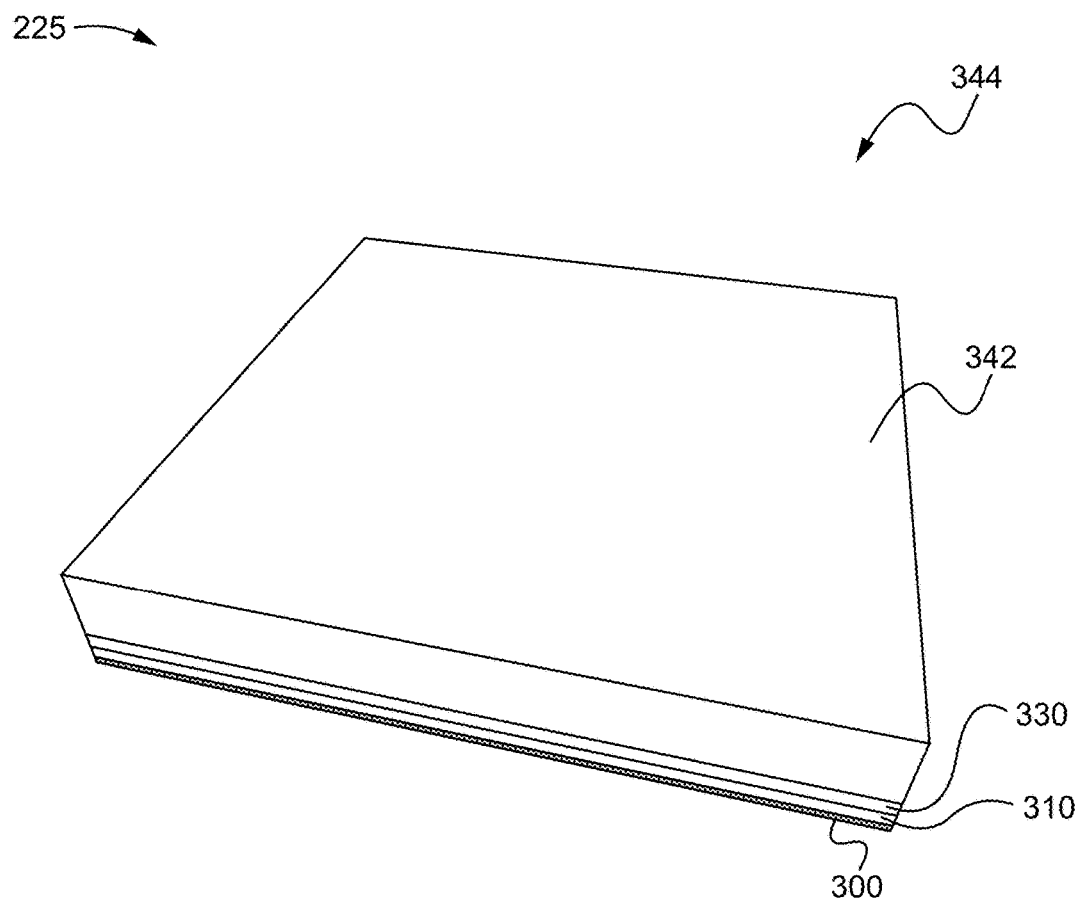
Figure 3N:
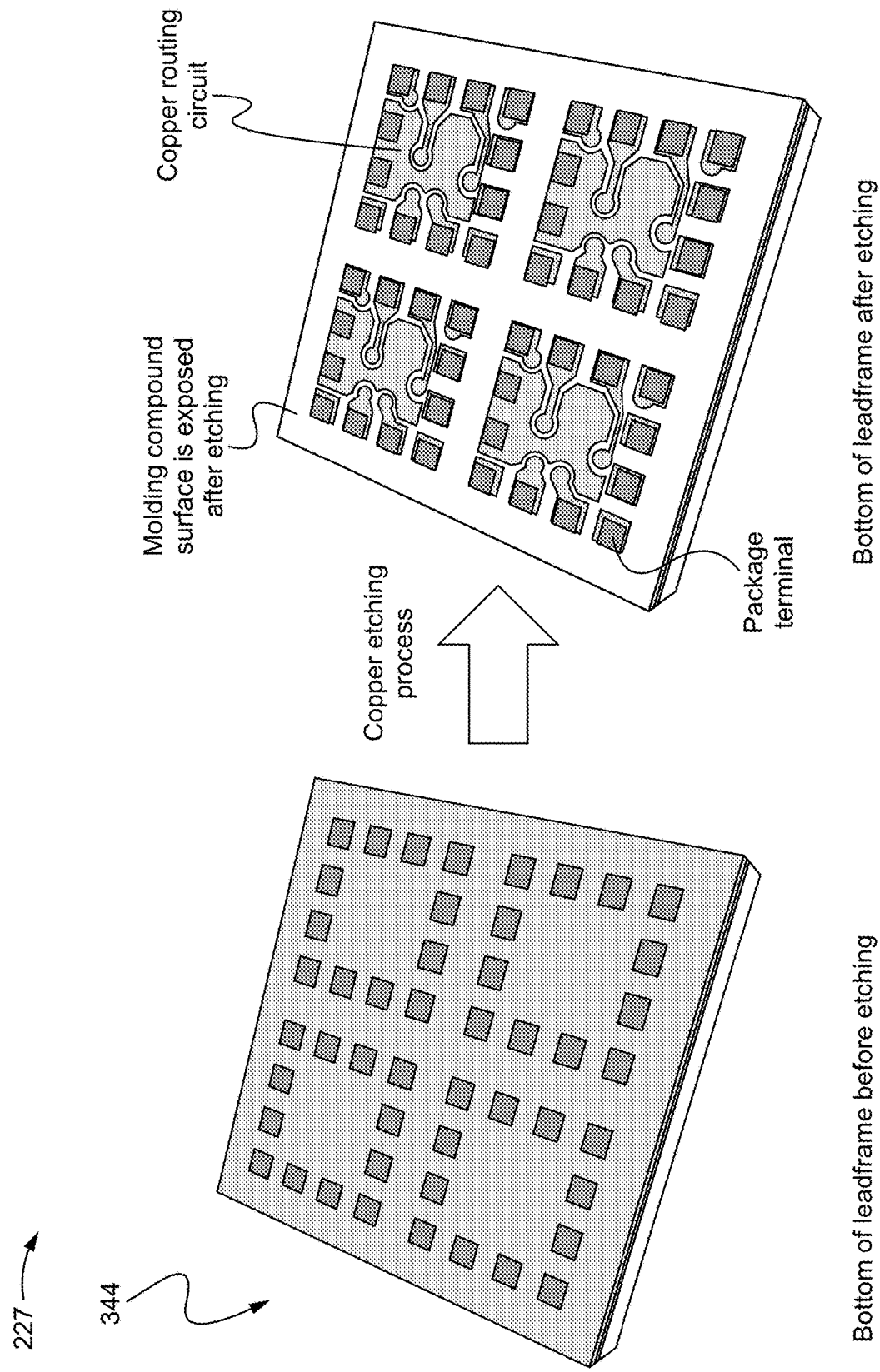
Figure 3O:
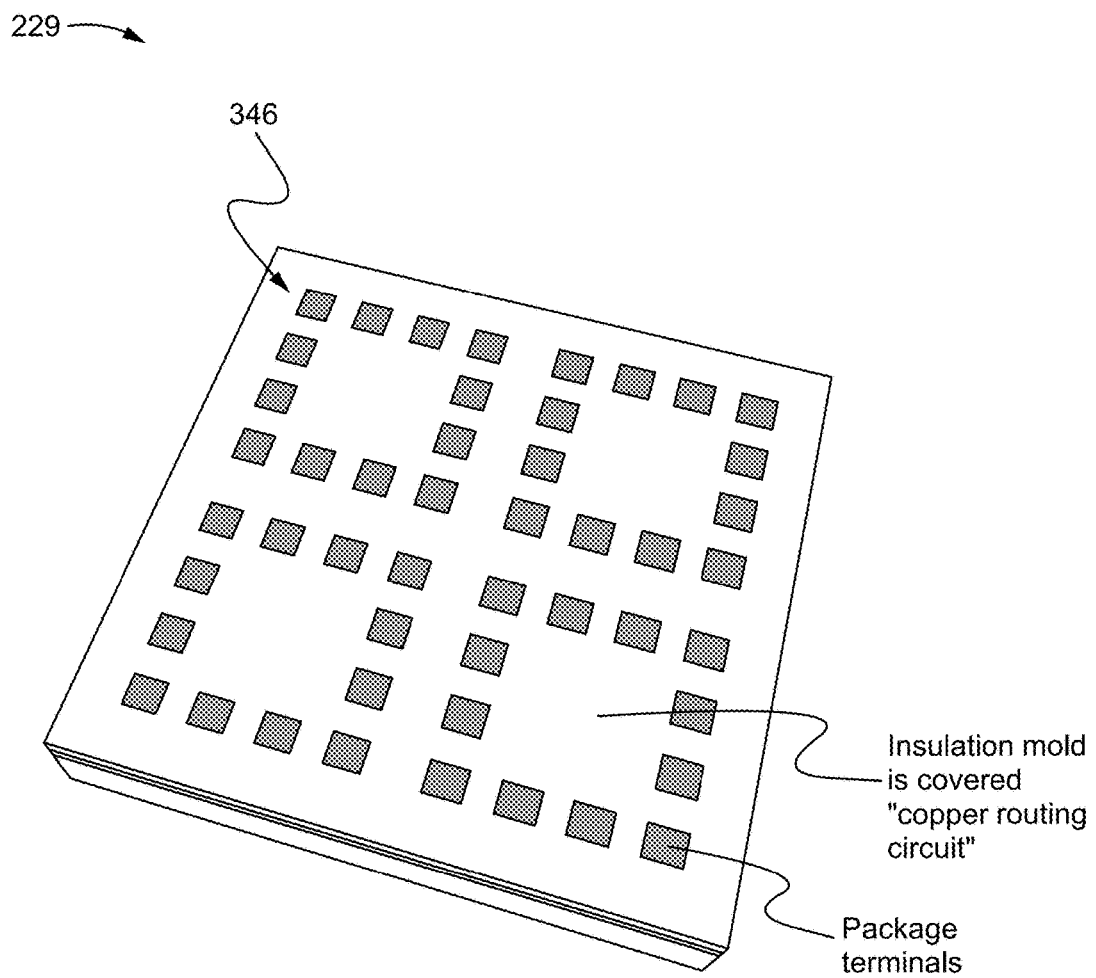
Figure 3P:
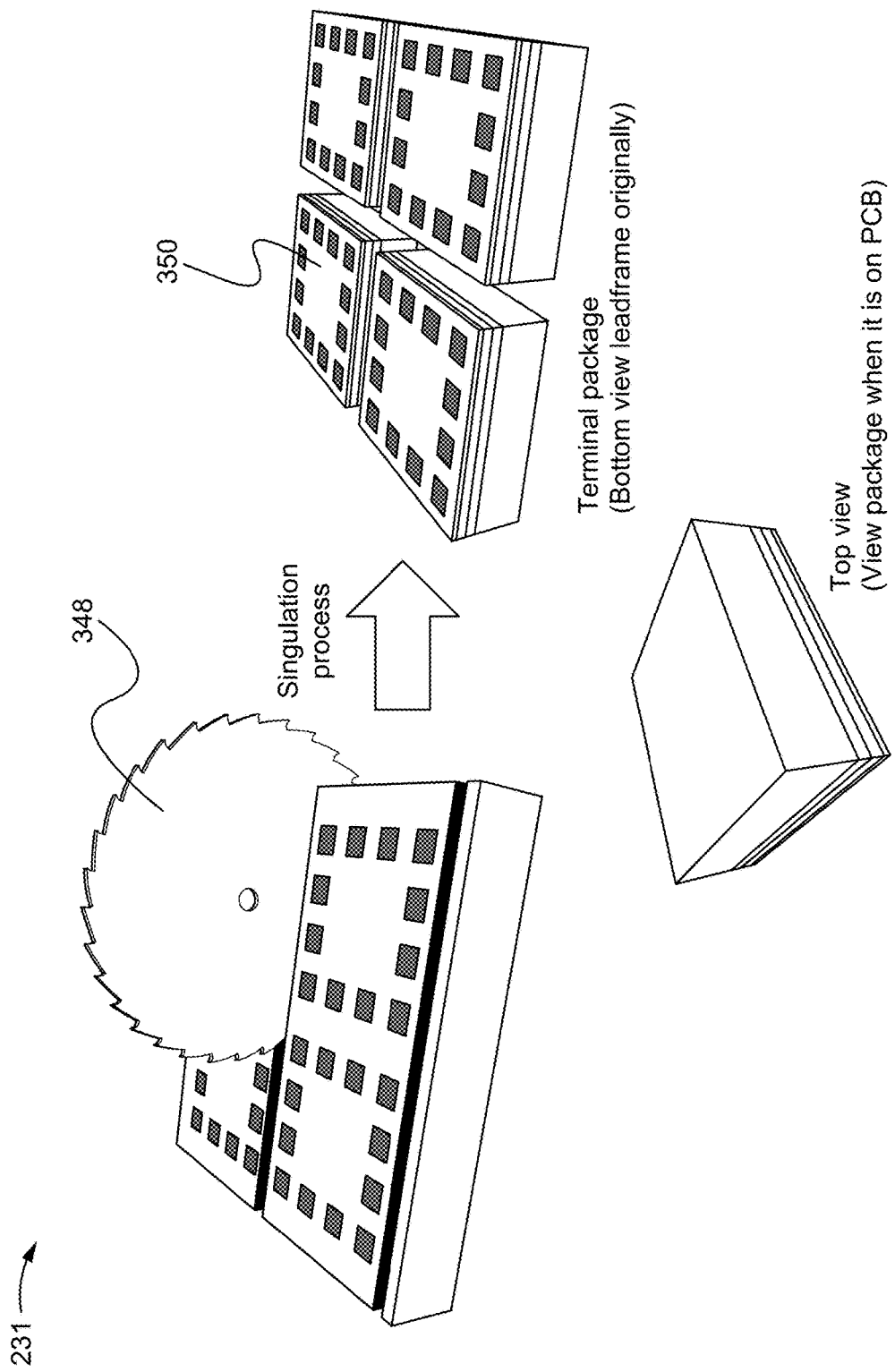

FIG. 2 illustrates an exemplary method 200 of manufacturing a semiconductor package in accordance with some embodiments. An exemplary result produced by each step of the method 200 is illustrated in FIGS. 3A-3P. Referring to FIGS. 2 and 3A-3P, the method 200 begins at a Step 201, where a plated and etched leadframe 300 is obtained. In some embodiments, the leadframe 300 is made of copper. A plurality of areas 302 on the bottom side of the leadframe 300 is plated to form package terminals. The top side of the leadframe 300 is etched away to form copper routing circuits 304, which are included in the bottommost conductive routing path layer 150 in FIG. 1C. A plurality of areas 306 on the top side of the leadframe 300 is also plated. In some embodiments, the top plated areas 306 are on the copper routing circuits 304. The number of bottom plated areas 302 is the same as the number of top plates areas 306, although the numbers can be different with the number of the bottom plated areas 302 being more or less than the number of the top plated areas 306. In some embodiments, the plating material is Ni+Pd+Au or any other suitable material(s).

At a Step 203, a plurality of interconnections 308 is formed on top of the leadframe 300. In some embodiments, the interconnections 308 are formed on the copper routing circuits 304 and coupled with the top plated areas 306. The material(s) of the interconnections 308 can be Cu, PdCu, AuPdCu wire, Ag wire, Ag allow wire and Au wire from a wire bond process, Ag alloy or the like, such as a soldering allow material. The process to apply this material(s) can be writing dispensing, printing (e.g., 3D inkjet printing), screen printing, electrical discharge coating, or any other suitable process.

At a Step 205, an insulation layer 310 is formed on top of the leadframe 300, resulting in a molded leadframe, to form a base of the second conductive routing path layer 160 in FIG. 1C. In some embodiments, the interconnections 308 protrude from the insulation layer 310. The material of this insulation layer 310 is a molding compound, which has a starting physical shape of a powder, pellet or sheet. The process to apply the molding compound 310 can be injection mold, transfer mold, compression mold, lamination mold, or any other suitable process. The molding material 310 includes compound fillers 310a and compound resin 310b. A magnified view is provided of the natural surface roughness 312 of a top surface of the insulation layer 310 before a surface treatment process (abrasion procedure). As discussed below, after the surface treatment process, the top surface of the insulation layer 310 has an unnatural surface roughness that is rougher than the natural surface roughness 312. The molding compound is on top of and surrounds the copper routing circuits 304.

To prepare the molding material 310 for better adhesion with a conductive ink layer, the top surface of the molding material 310 is roughened so that the top surface has an unnatural surface roughness that is rougher than the natural surface roughness 312. At a Step 207, a coating process is performed to coat an "adhesion promoter" material 314 on at least the top surface of the insulation layer 310. The coating process can be either a spraying or dipping process. A magnified view is provided of the layer of adhesion promoter 314 directly on top of the molding compound 310.

At a Step 209, the molded leadframe with the adhesion promoter material 314 is heated. In some embodiments, the molded leadframe with the substrate adhesion promoter material 314 is heated to 90° C. to 150° C. for approximately 10 minutes, for example, in an oven. Other temperatures and other heating durations are contemplated. The adhesion promoter material 314 is activated with the heat, thereby reacting with a portion 316 of the molding compound 310, resulting in a baked film. In particular, the adhesion promoter material 314 reacts with the molding resin 310b in the portion 316 of the molding compound 310 but not with the compound filler 310a in the portion 316 of the molding compound 318.

At a Step 211, the baked film is etched away, leaving the surface of the molding compound 310 rougher 318 than the natural surface roughness 312 of the molding compound 310 (e.g., before the surface treatment process). Put differently, after the baked film is etched away, the surface of the molding compound 310 has an unnatural surface roughness 318. In some embodiments, a wet chemical permanganic acid is used to etch out the baked film, resulting in a roughened leadframe. The roughness 318 of the surface of the molding compound 310, which is created at least by the compound fillers 310a, provides anchor points for an activator chemical in a catalysis process. Other abrasion processes are contemplated to roughen the top surface of the molding compound 1008 to obtain an unnatural surface roughness.

At a Step 213, a depositing process is performed to coat a seed layer of the activator chemical 320 on the roughened leadframe. The depositing process can be an inkjet printing process. In some embodiments, the activator chemical 320 includes Pd (Palladium), which reacts as a catalyst substance. In some embodiments, the activator chemical 320 includes a catalyst substance other than Pd. In some embodiments, the activator chemical 320 includes additional additives. The catalyst substance anchors on to the roughened surface 318 of the molding compound 310, resulting in an active leadframe, which has an active molding compound surface. The seed layer allows for the subsequent ink printing of conductive ink to adhere to the molding compound 310 more efficiently. In some embodiments, the seed layer is optional for making conductive paths 322.

The inkjet printing deposits or prints the activator chemical 320 to create a precise and/or exact structure of conductive paths 322, which are also referred to as conductive ink routing circuits, on the molding compound 310, resulting in a seed patterned leadframe. In some embodiments, a desired design of the conductive paths 322 stored in memory of a computing device is received by a printer such that the activator chemical 320 is precisely and/or exactly printed on the molding compound 310 according to the desired design. In other words, the inkjet printing of the activator chemical 320 allows for the structure of the conductive ink routing circuits 322 to be precisely and/or exactly created according to the design without performing additional steps, such as a step to remove unwanted portions of the seed layer, after the inkjet printing to obtain the structure of the conductive paths 311. High resolution and precise inkjet printing can be achieved by the printer. The molding compound 310 is exposed at nonprinted areas 328a. The structure of the conductive paths 322 is directly over the interconnections 308 such that the conductive paths 322 eventually formed will be in electrical communication with the interconnections 308 and with all conductive paths in previous conductive routing layers.

At a Step 215, a printing process is performed to apply or print conductive ink 324 on the seed patterned leadframe, resulting in an ink printed leadframe. The printing process is an inkjet printing process that uses a similar or the same printer as in the Step 213. The conductive ink 324 is printed precisely and/or exactly over the structure of the conductive paths 322 created in the Step 213. To achieve good adhesion of the conductive ink 324 to the seed layer, sintering (e.g., oven sintering) is applied after the conductive ink 324 is printed on the seed patterned leadframe. The adhesion of the conductive ink layer 324 with the molding compound 110 having the roughened surface 318 is better than the adhesion of the conductive ink layer 324 with one having the natural surface roughness 312 prior to the surface treatment process.

Multi-conductive ink layers can be printed on top of each other to obtain a desired thickness of the conductive paths 322 on the molding compound 310. These conductive ink routing circuits 322 on the molding compound 310 are included in the second conductive routing path layer 160 in FIG. 1C. One method is to perform the steps of printing the activator chemical on the leadframe (the Step 213), and printing the conductive ink on the leadframe (the Step 215) in one or more loops until a desired thickness of the conductive paths 322 is obtained. Each new conductive ink substance anchors to the previous anchored conductive ink on the molding compound surface or on a previous anchored conductive ink on conductive ink.

Figure 4A:
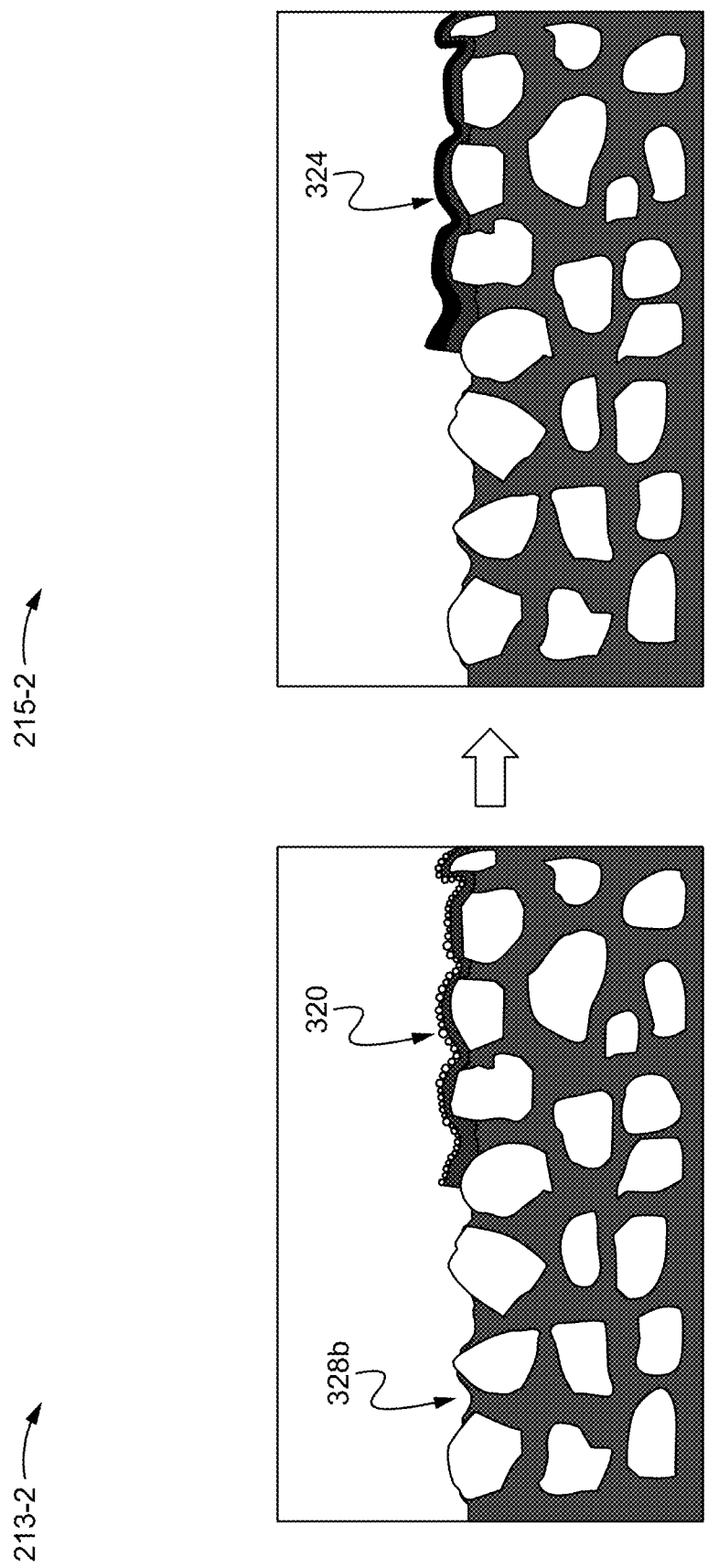
FIG. 4A-FIG. 4B illustrate exemplary views of forming multi-printed layers in accordance to some embodiments.
Figure 4B:
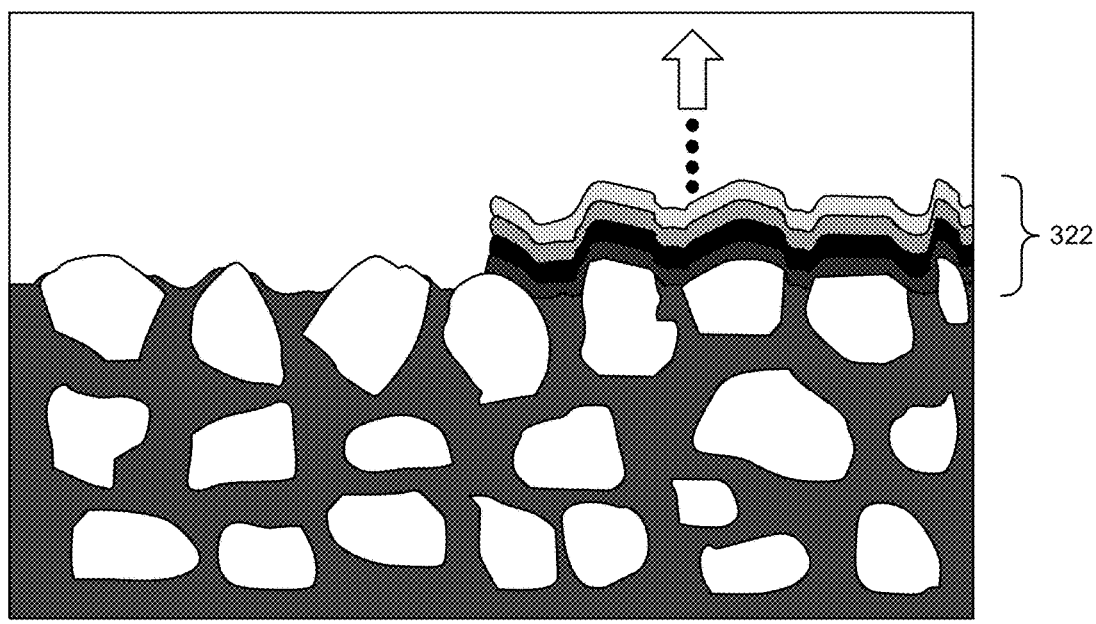

FIGS. 4A-4B illustrate an exemplary loop in accordance with some embodiments. At a Step 213-2, another coating process is performed to coat the activator chemical 320 on the previously ink printed leadframe, such as from the Step 215. The activator chemical 320 is coated precisely and/or exactly over the conductive ink routing circuit 322. The Step 213-2 helps the next ink printing layer occur faster. The molding compound 310 is again exposed at nonprinted areas 328b, which corresponds to and directly over the previously nonprinted areas 328a. At a Step 215-2, another printing process is performed to print the substrate with the conductive ink 324 and to transform the conductive ink (which is a liquid) to conductive solid such as via oven sintering. The final result is that the new conductive ink substance anchors on to the surface of the previous conductive ink printing. The new conductive ink layer is stacked on the previous conductive ink layer. This reaction can occur in a loop until a desired thickness of the conductive paths 322 is obtained, as illustrated in FIG. 4B. Although FIG. 4B shows the conductive ink routing circuits 322 as having four ink printing layers, more or less conductive ink printing layers are contemplated.

In the case additional routing path layers are required, returning to the method 200, at the Step 217, a plurality of interconnections 326 is formed on top of the leadframe 300. In some embodiments, the interconnections 326 are formed on the conductive ink routing circuits 322. The interconnections 326 are made of the same or different material as the interconnections 308. The process of applying the interconnections 326 can be the same as or different from the process of applying the interconnections 308.

At the Step 219, an insulation layer 330 is formed on top of the leadframe 300 to form a base of the next (e.g., third) conductive routing path layer 170 in FIG. 1C. In some embodiments, the interconnections 326 protrude from the insulation layer 330. The material of this insulation layer 330 can be the same as or different from the material of the insulation layer 310. The process of applying the molding compound 330 can be the same as or different from the process of applying the molding compound 310. The molding compound is on top of and surrounds the conductive ink routing circuits 322.

At the Step 221, conductive paths 332 on the molding compound 330 are formed from the process described above. The conductive paths 332 can have the same or different shape as the conductive paths in any of the previous routing layers (e.g., conductive paths 322) as long as the conductive paths 332 are directly over and in electrical communication with the interconnections 326. These conductive ink routing circuits 332 on the molding compound 330 is included in the third conductive routing path layer 170 in FIG. 1C.

In the same manner, if the semiconductor package requires additional conductive routing path layers, the Steps 217 to 221 can be repeated until a number of conductive routing path layers are obtained.

At a Step 223, a plurality of semiconductor dies 334 is coupled on the conductive paths on the topmost conductive routing path layer (e.g., the topmost conductive routing path layer 170 in FIG. 1C) using epoxy, with at least one semiconductor die 334 in each IC packaging section. In some embodiments, wire bonds 336 electrically couple the electrical pads 340 on the dies 334 and the pads 338 on the molding compound 330 that is associated with the topmost routing path layer.

At a Step 225, at least the plurality of semiconductor dies 334 and the topmost conductive routing path layer are encapsulated with a molding compound 342, resulting in a molded leadframe strip 344.

At a Step 227, a chemical etching process, such as a copper chemical etching dip process or a copper chemical etching spray process, is performed on the molded leadframe strip 344. At the bottom of the molded leadframe strip 344, the copper surface that is covered with the pre-plated metal from the Step 201 is not etched away, while the copper surface that is not covered with the pre-plated metal from the Step 201 is etched away. The chemical etching process reacts with the copper until it reaches the molding compound 310. After the copper is removed, the package terminals are isolated from each other and the copper routing circuits 304 of the first routing path layer is revealed at the bottom of the molded leadframe strip 344.

At a Step 229, an insulation layer 346 is formed on bottom of the molded leadframe strip 344 such that the copper routing circuits 304 is covered but the package terminals are exposed. In some embodiments, the package terminals are flush with the insulation layer 346. Alternatively, the package terminals protrude from the insulation layer 346. The insulation layer 346 protects the copper routing circuits 304 from causing issues with its environment, such as in a printed circuit board.

At a Step 231, a cut through procedure is performed to isolate semiconductor packages 350 from the leadframe 344. A tool 348, such as a saw, is used to fully cut the leadframe along the singulation paths. Each semiconductor package 350 is similarly configured as the semiconductor package 100.

A semiconductor package, such as the singulated semiconductor package 350, includes package terminals, and a copper leadframe routing layer that includes copper routing circuits. The copper routing circuits are formed on a first side of a copper leadframe and the package terminals are formed on a second side of the copper leadframe.

The semiconductor package also includes at least one conductive ink printed routing layer. Each of the at least one conductive ink printed routing layer includes a plurality of interconnections coupled with routing circuits associated with a previous routing layer that is directly beneath the current conductive ink printed routing layer, and an intermediary insulation layer formed on top of the previous routing layer. The plurality of interconnections protrudes from a top surface of the intermediary insulation layer that has an unnatural surface roughness that is rougher than the natural surface roughness of the intermediary insulation layer. Molding compound of the intermediary insulation layer surrounds the routing circuits associated with the previous routing layer. Each of the at least one conductive ink printed routing layer also includes conductive ink routing circuits adhered on the unnaturally roughened top surface of the intermediary insulation layer. The conductive ink routing circuits includes a plurality of conductive ink printed layers and ink printed edges.

In some embodiments, the routing circuits associated with each routing layer is structured differently from the routing circuits associated with other routing layers. In some embodiments, the conductive ink routing circuits associated with each of the at least one conductive ink printed routing layer is structured differently from the conductive ink routing circuits associated with other conductive ink printed routing layers.

The conductive ink includes a liquid vehicle. In some embodiments, the conductive ink includes powdered or flaked silver, gold or the like. In some embodiments, the powdered metal includes nano-particles of the metal. In some embodiments, the conductive ink also includes carbon-like materials.

The semiconductor package includes an internal routing circuit from die terminals on the die to the package terminals. The internal routing circuit is formed by all the routing layers in the semiconductor package. The semiconductor package also includes a die coupled with a topmost conductive ink printed routing layer, a topmost insulation layer encapsulating the die and the topmost conductive ink routing layer, and a bottommost insulation layer encapsulating the copper routing circuits.

Figure 5A:
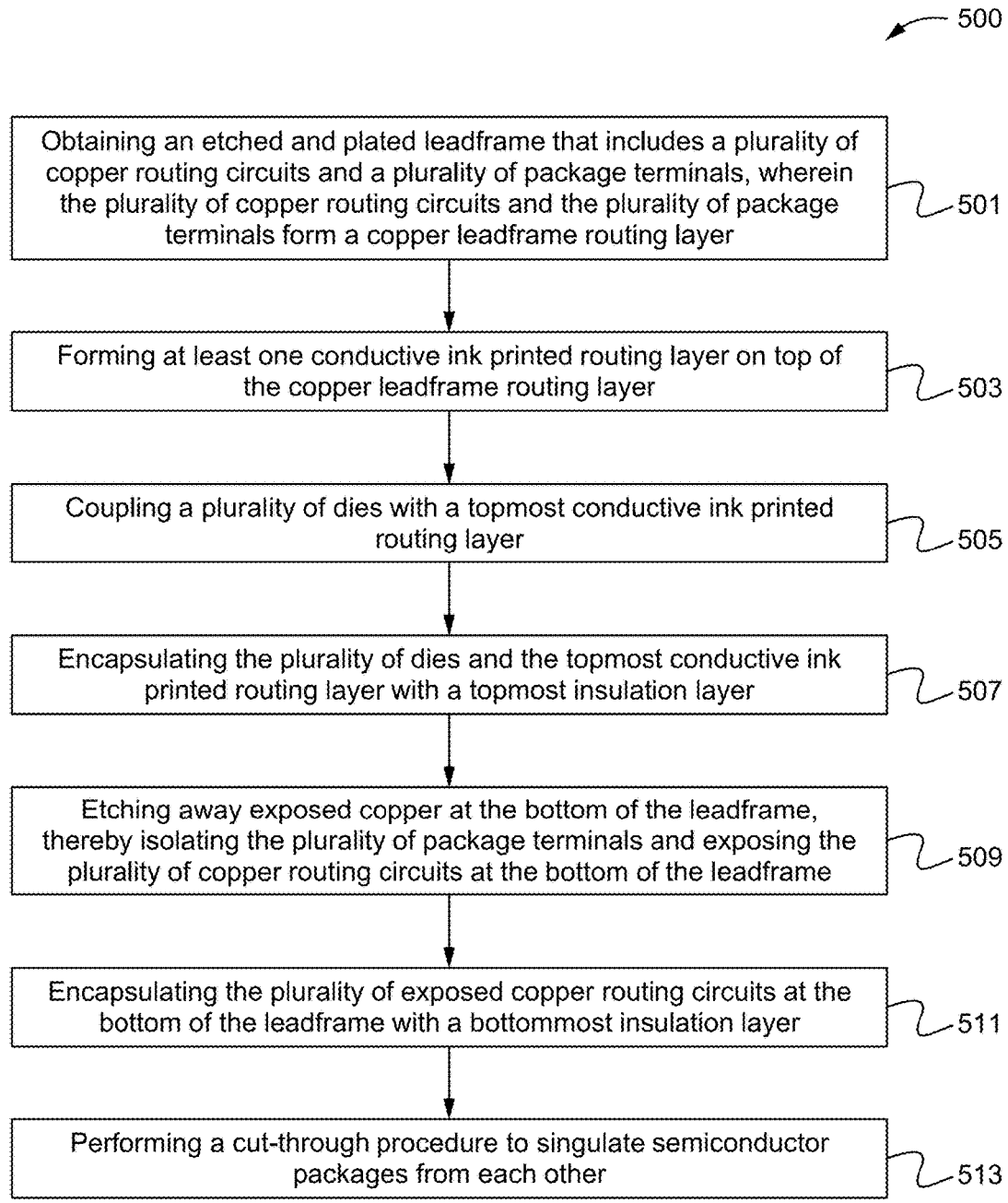
FIG. 5A-FIG. 5B illustrate an exemplary method of manufacturing semiconductor devices that each includes a plurality of conductive routing layers accordance with some embodiments.

FIG. 5A illustrates an exemplary method 500 of manufacturing semiconductor devices that each includes a plurality of conductive routing layers in accordance with some embodiments. The method 500 begins at a Step 501, where an etched and plated leadframe is obtained. The etched and plated leadframe includes a plurality of copper routing circuits and a plurality of package terminals. The plurality of copper routing circuits forms a copper leadframe routing layer. In some embodiments, the etched and plated leadframe is obtained by etching a copper substrate to form the plurality of copper routing circuits at a top surface of the copper substrate, and plating a plurality of areas on surfaces of the copper substrate, thereby resulting in the etched and plated leadframe. The plurality of areas includes bottom plated areas that eventually form the plurality of package terminals and includes top plated areas that are on the plurality of copper routing circuits.

At a Step 503, at least one conductive ink printed routing layer is formed on top of the copper leadframe routing layer. Each of the at least one conductive ink printed routing layer is formed by the method 550 illustrated in FIG. 5B.

Figure 5B:
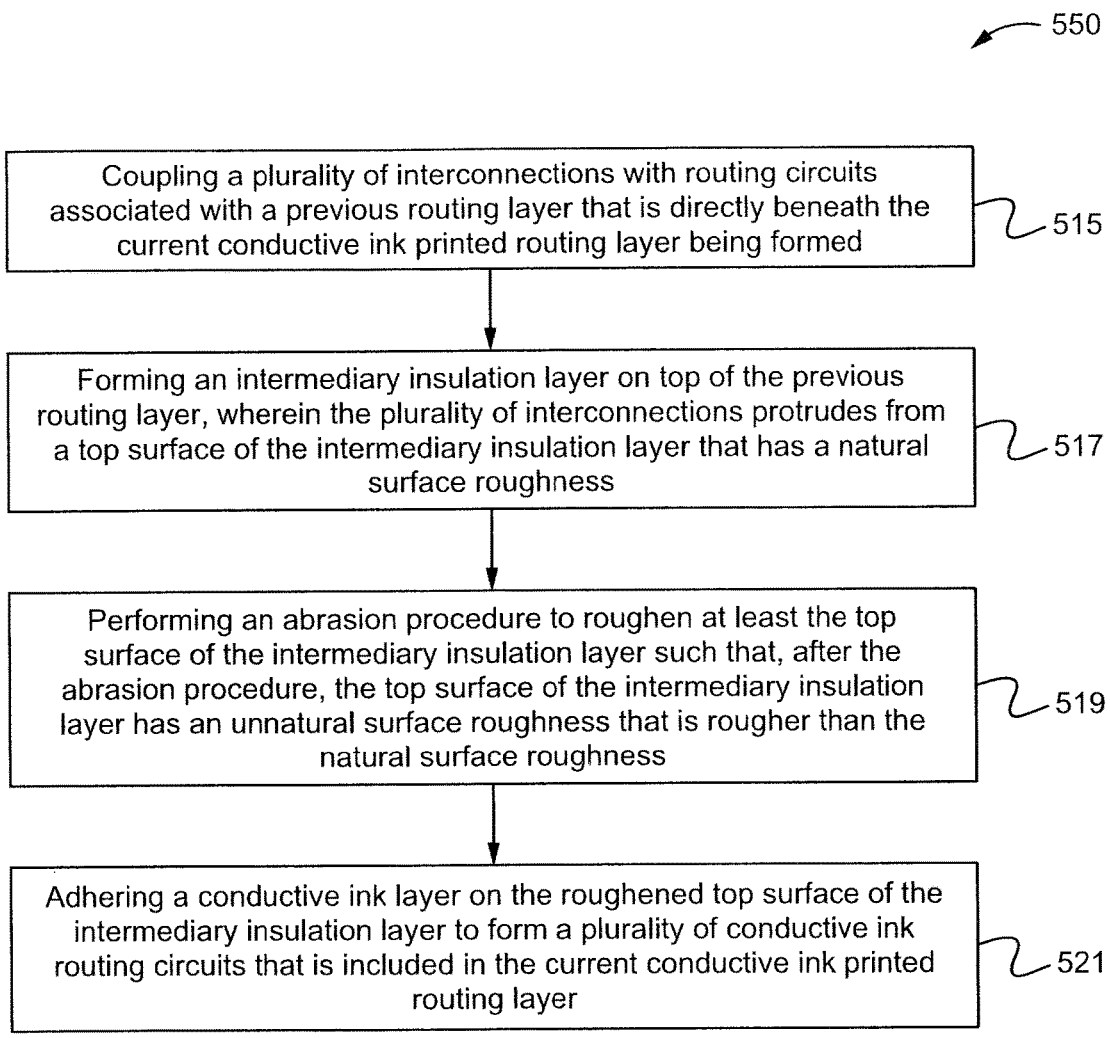

Referring to FIG. 5B, at a Step 515, a plurality of interconnections is coupled with routing circuits associated with a previous routing layer that is directly beneath the current conductive ink printed routing layer being formed.

At a Step 517, an intermediary insulation layer is formed on top of the previous routing layer. The plurality of interconnections protrudes from a top surface of the intermediary insulation layer that has a natural surface roughness.

At a Step 519, an abrasion procedure is performed to roughen at least the top surface of the intermediary insulation layer such that, after the abrasion procedure, the top surface of the intermediary insulation layer has an unnatural surface roughness that is rougher than the natural surface roughness.

In some embodiments, the abrasion procedure includes coating at least the top surface of the intermediary insulation layer with an adhesion promoter material, heating the leadframe such that the adhesion promoter material reacts with a portion of the intermediary insulation layer, and etching away a baked film, resulting in the top surface of the intermediary insulation layer having the unnatural surface roughness that is rougher than the natural surface roughness.

In some embodiments, a catalyst material is printed on the roughened top surface of the intermediary insulation layer. The printing of the catalyst material precisely forms a structure of the plurality of conductive ink routing circuits.

At a Step 521, a conductive ink layer is adhered on the roughened top surface of the intermediary insulation layer to form a plurality of conductive ink routing circuits that is included in the current conductive ink printed routing layer. The conductive ink layer can be adhered on the roughened top surface includes using a conductive ink and transforming the conductive ink (which is a liquid) to conductive solid. In some embodiments, the transformation is via oven sintering the leadframe. The adhesion of the conductive ink layer with the intermediary insulation layer having the unnatural surface roughness is better than the adhesion of the conductive ink layer with the intermediary insulation layer having the natural surface roughness.

In some embodiments, a desired thickness of the conductive ink routing circuits is obtained whereby conductive ink is printed on conductive ink. The desired thickness of the conductive ink routing circuits is obtained via a printing process, wherein the printing process includes repeating the printing a catalyst material step and the adhering step in one or more loops.

Returning to FIG. 5A, at a Step 505, a plurality of dies is coupled with a topmost conductive ink printed routing layer.

At a Step 507, the plurality of dies and the topmost conductive ink printed routing layer are encapsulated with a topmost insulation layer.

At a Step 509, exposed copper at the bottom of the leadframe is etched away, thereby isolating the plurality of package terminals and exposing the plurality of copper routing circuits at the bottom of the leadframe.

At a Step 511, the plurality of exposed copper routing circuits at the bottom of the leadframe is encapsulated with a bottommost insulation layer.

At a Step 513, a cut-through procedure is performed to singulate the semiconductor packages from each other.

It is noted that the demonstration discussed herein is on a semiconductor package with three conductive routing path layers. However, by the concept of this invention, it is possible to create more conductive routing layers to stack on each other such that a final semiconductor package can have more than three conductive routing path layers.

One of ordinary skill in the art will realize other uses and advantages also exist. While the invention has been described with reference to numerous specific details, one of ordinary skill in the art will recognize that the invention can be embodied in other specific forms without departing from the spirit of the invention. Thus, one of ordinary skill in the art will understand that the invention is not to be limited by the foregoing illustrative details, but rather is to be defined by the appended claims.

We claim:
1. A semiconductor package comprising:
   package terminals;
   a copper leadframe routing layer including copper routing circuits that are etched from a copper leadframe;
   at least one conductive ink printed routing layer, wherein each of the at least one conductive ink printed routing layer includes:

a plurality of interconnections coupled with routing circuits associated with a previous routing layer that is directly beneath a current conductive ink printed routing layer;

an intermediary insulation layer formed on top of the previous routing layer, wherein the plurality of interconnections protrudes from a top surface of the intermediary insulation layer that has an unnatural surface roughness that is rougher than the natural surface roughness of the intermediary insulation layer; and conductive ink routing circuits adhered on the unnaturally roughened top surface of the intermediary insulation layer;

a die coupled with a topmost conductive ink printed routing layer;

a topmost insulation layer encapsulating the die and the topmost conductive ink routing layer; and a bottommost insulation layer encapsulating the copper routing circuits.

2. The semiconductor package of claim 1, wherein the copper routing circuits are formed on a first side of the copper leadframe and the package terminals are formed on a second side of the copper leadframe.

3. The semiconductor package of claim 2, wherein each of the conductive ink routing circuits includes a plurality of conductive ink printed layers.

4. The semiconductor package of claim 3, wherein the routing circuits associated with each routing layer is structured differently from the routing circuits associated with other routing layers.

5. The semiconductor package of claim 4, wherein the conductive ink routing circuits associated with each of the at least one conductive ink printed routing layer is structured differently from the conductive ink routing circuits associated with other conductive ink printed routing layers.

6. The semiconductor package of claim 5, wherein molding compound of the intermediary insulation layer surrounds the routing circuits associated with the previous routing layer.

7. The semiconductor package of claim 6, wherein the conductive ink includes powdered or flaked silver and carbon-like materials.

8. The semiconductor package of claim 7, further comprising an internal routing circuit from die terminals on the die to the package terminals, wherein the internal routing circuit is formed by all the routing layers in the semiconductor package.

9. The semiconductor package of claim 8, wherein exposed surfaces of the package terminals are flush with a bottom surface of the bottommost insulation layer.

10. A semiconductor package comprising:
package terminals;
a copper leadframe routing layer including copper routing circuits that are etched from a copper leadframe;
at least one conductive ink printed routing layer, wherein each of the at least one conductive ink printed routing layer includes:
a plurality of interconnections coupled with routing circuits associated with a previous routing layer that is directly beneath a current conductive ink printed routing layer;
an intermediary insulation layer formed on top of the previous routing layer, wherein the plurality of interconnections protrudes from a top surface of the intermediary insulation layer that has an unnatural surface roughness that is rougher than the natural surface roughness of the intermediary insulation layer; and
conductive ink routing circuits adhered on the unnaturally roughened top surface of the intermediary insulation layer, wherein each of the conductive ink routing circuits includes a plurality of conductive ink printed layers and a plurality of seed printed layers;
a die coupled with a topmost conductive ink printed routing layer;
a topmost insulation layer encapsulating the die and the topmost conductive ink routing layer; and
a bottommost insulation layer encapsulating the copper routing circuits.

11. The semiconductor package of claim 10, wherein the conductive ink includes powdered or flaked silver and carbon-like materials.

12. The semiconductor package of claim 10, wherein each of the plurality of conductive printed layers is directly above and adhered to one of the plurality of seed printed layers.

13. The semiconductor package of claim 10, wherein a bottommost seed printed layer of the plurality of seed printed layers of a conductive ink printed routing layer that is directly above the copper leadframe routing layer, anchors to the unnatural roughened top surface of the intermediary insulation layer and has the same pattern as the conductive ink routing circuits.

14. The semiconductor package of claim 10, wherein the unnatural surface roughness is formed by compound fillers in the intermediary insulation layer protruding beyond compound resin in the intermediary insulation layer.

15. The semiconductor package of claim 10, wherein the entirety of the top surface of the intermediary insulation layer has the unnatural surface roughness.

* * * * *